(12) United States Patent
Hayashi et al.

(10) Patent No.: US 6,791,660 B1
(45) Date of Patent: Sep. 14, 2004

(54) METHOD FOR MANUFACTURING ELECTROOPTICAL DEVICE AND APPARATUS FOR MANUFACTURING THE SAME, ELECTROOPTICAL DEVICE AND ELECTRONIC APPLIANCES

(75) Inventors: Kenji Hayashi, Suwa (JP); Shigeki Tanaka, Okaya (JP); Hidekazu Kobayashi, Hara-mura (JP); Makoto Nakadate, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 3 days.

(21) Appl. No.: 10/356,467

(22) Filed: Feb. 3, 2003

(30) Foreign Application Priority Data

Feb. 12, 2002 (JP) ........................................ 2002-034699
Feb. 12, 2002 (JP) ........................................ 2002-034700

(51) Int. Cl.⁷ ........................................... G02F 1/1339
(52) U.S. Cl. ....................................... 349/190; 349/153
(58) Field of Search ................................... 349/190, 153

(56) References Cited

U.S. PATENT DOCUMENTS

| | | | | |
|---|---|---|---|---|
| 6,137,559 A | * | 10/2000 | Tanaka et al. | 349/153 |
| 6,222,603 B1 | * | 4/2001 | Sakai et al. | 349/153 |
| 6,473,148 B1 | * | 10/2002 | Suh | 349/153 |
| 6,642,992 B2 | * | 11/2003 | Kim | 349/191 |

FOREIGN PATENT DOCUMENTS

| | | |
|---|---|---|
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |

* cited by examiner

*Primary Examiner*—James A. Dudek
(74) *Attorney, Agent, or Firm*—Oliff & Berridge, PLC

(57) ABSTRACT

The present invention provides a method of manufacturing an electrooptical device including a first member on which an electrooptical element is disposed, and a second member covering the electrooptical element. The method includes (a) feeding an adhesive material to the first region and second region of the joint region to bond the first member and second member; (b) bonding the first member and second member with interposition of the adhesive material; (c) hardening the adhesive material fed to the first region of the joint region; and (d) hardening the adhesive material fed to the second region of the joint region after step (c). The present invention provides a method of manufacturing the electrooptical device having high productivity.

9 Claims, 15 Drawing Sheets

(a)

(b)

(a)

(b)

(a)

(b)

(a)

(b)

(c)

METHOD FOR MANUFACTURING ELECTROOPTICAL DEVICE AND APPARATUS FOR MANUFACTURING THE SAME, ELECTROOPTICAL DEVICE AND ELECTRONIC APPLIANCES

BACKGROUND OF THE INVENTION

1. Field of Invention

The present invention relates to a method of manufacturing an electrooptical device and an apparatus to manufacture the same, an electrooptical device and electronic appliances including the electrooptical device. In particular, the present invention relates to a method of manufacturing an electrooptical device including a luminous element, such as an organic EL element, an electrooptical device, and electronic appliances.

2. Description of Related Art

Related art electrooptical devices such as liquid crystal device and organic EL (electroluminescence) device include a plurality of circuit elements, electrodes, and a liquid crystal or an EL element laminated on a substrate. For example, the organic EL device has a luminous element including a luminous layer containing luminous substances interposed between electrode layers of an anode and a cathode. Positive holes injected from the anode side and electrons injected from the cathode side are recombined in a luminous layer having light emitting ability, and light is emitted when the electrons are deactivated from an excited state.

However, the related art electrooptical device as described above is subject to the following problems.

Since the organic EL device having the above construction includes an electric current driving luminous element, an electric current is required to flow between the anode and cathode to emit light. Consequently, the element is heated while emitting the light, and the element is deteriorated by accelerating oxidation of the materials constituting the element due to oxygen and moisture, when the element is placed in an environment containing oxygen and moisture. Alkali metals and alkali earth metals used for the cathode are particularly liable to be oxidized. Generation and growth of dark spots are representative examples of deterioration of the element by oxidation and moisture. The dark spots mean defects of luminous points. Decrease and instability of luminance due to decrease of stability with time, and short service life have been the problems related to advanced deterioration of the luminous element related to driving of the organic EL device.

Accordingly, a method of blocking the electrooptical device from the atmosphere has been developed as one of the countermeasures to reduce or suppress the element from being deteriorated, wherein a substrate on which the luminous element is disposed and a seal member are integrated with an adhesive, and the luminous element is disposed in a space formed with the substrate, seal member and adhesive. However, since the substrate and seal member may slip out of position unless the electrooptical device is transferred after the adhesive has been completely hardened when, for example, the electrooptical device is transferred during the manufacturing process, it creates a problem that productivity is decreased because the electrooptical device cannot be transferred, or the transfer speed should be slow even when it is transferred, before the adhesive is completely hardened.

SUMMARY OF THE INVENTION

The invention addresses or solves the above and/or other problems, and provides a method of manufacturing an electrooptical device by which high productivity is maintained in bonding a substrate and seal member, an electrooptical device, and electronic appliances including the electrooptical device.

The present invention provides a method of manufacturing the electrooptical device including a first member on which an electrooptical element is disposed, and a second member covering the electrooptical element, including:

(a) feeding an adhesive material to first and second regions of a joint region to bond the first member and second member;

(b) bonding the first member and second member with the adhesive material;

(c) hardening the adhesive material fed to the first region of the joint region; and (d) hardening the adhesive fed to the second region of the joint region after the step (c).

Preferably, step (a) in the above manufacturing method includes:

(a-1) feeding a first adhesive material to the first region of the joint region; and (a-2) feeding a second adhesive material different from the first adhesive material to the second region of the joint region.

According to the present invention, the first member and second member may be temporarily assembled with the first adhesive material within a short period of time to reduce an waiting time of hardening, by disposing first material and second material at the bonding region, and by employing, for example, a material capable of hardening within a short period of time by a first treatment as the first adhesive material. Accordingly, efficiency of succeeding manufacturing steps may be enhanced while maintaining high productivity. An electrooptical device exhibiting desired performance, may be manufactured using the second adhesive, by employing a material having desired performance such as high sealing ability, as the second seal material. The luminous element is formed between the first member and second member using a material having high sealing performance as the second adhesive in order to hermetically seal the luminous element with the first member and second member.

The first adhesive is a light-curable adhesive, and the second adhesive is a thermosetting adhesive. Desirably, step (c) includes:

(c-1) irradiating a light having a prescribed wavelength to a light-curable material fed on the first region; and step (d) includes:

(d-1) heating a thermosetting material fed on the second region.

Consequently, the first and second members can be temporarily assembled within a short period of time by irradiating the first material with a light, such as a UV light. Employing the thermosetting material as the second material enables sealing performance to be enhanced. The first adhesive material and second adhesive material may be any adhesives capable of bonding the first member and second member, and the adhesive available includes the adhesives including the UV curable material and thermosetting material as described above, as well as an EB (electron beam) curable material, two-part curable materials and thermoplastic materials called as hot-melt materials. The material suitable for the first adhesive is able to temporarily assemble the first member and second member by hardening within a short period of time, and the material suitable for the second adhesive material is able to reduce or block air and moisture from invading into the space formed between the first member and second member.

Desirably, steps (a) to (d) are performed in an inert gas atmosphere in the manufacturing method above in order to prevent the luminous element from being deteriorated or reduce such deterioration. The inert gas as used herein is a gas that is inert to the luminous element including nitrogen gas and argon gas.

In the manufacturing method above, step (a) desirably includes:
- (a-3) discontinuously feeding the adhesive material to the first and second regions of the joint region.

Step (b) desirably includes:
- (b-1) compressing the first member and second member so that the adhesive material fed discontinuously in the step (a-3) contacts with each other.

The adhesives may be overflowed to the portions outside of the joint region to cause poor hermetic sealing when the first member and second member are compressed in step (b). However, since the first adhesive material or second adhesive material is discontinuously disposed, the pressurized gas within the space formed between the first member and second member can be discharged through discontinuous parts (gaps) at the initial stage of compression. Since the first member and second member are quite intimately contact with each other thereafter, the adhesive materials form a continuous layer due to a capillary action generated, and the space formed between the first and second members are completely isolated from the external environment and hermetically sealed.

Using other materials, such as a hygroscopic material, together with the first and second adhesive materials permits moisture to be reduced or prevented from invading into the luminous element from the outside to enable the element to be further protected from being deteriorated. High performance of the electrooptical device may be also expected by using a material having desired functions as the other material. The other material as used herein may be an adhesive capable of bonding the first member and second member, or may be a material other than the adhesive.

The second region of the joint region is wider than the second region in the manufacturing method above. Desirably, step (a) includes:
- (a-4) feeding the light-curable material to the first and second regions of the joint region;

step (c) includes:
- (c-1) irradiating a light having a prescribed wavelength to the light-curable material fed on the first region; and step (d) includes:
- (d-2) irradiating a light having a prescribed wavelength to the light-curable material fed at least on the second region.

According to the present invention, the first and second members can be temporarily assembled within a short period of time by curing the light-curable material in the first region by irradiating a light to the first region in the first light-irradiating step (c-1) after feeding the light-curable material to the joint region. Consequently, efficiency of the subsequent manufacturing steps may be enhanced by shortening the waiting time of hardening. Irradiating a light to the second region as a region wider than the first region (step (d-2) permits the bonding force between the first member and second member to be enhanced by hardening the light-curable material in the second region. Workability and productivity may be enhanced by independently applying the first light-irradiation step by which the first member and second member are temporarily assembled by hardening a part of the light-curable material, and the second light-irradiation step by which all the light-curable material is hardened. Hardening all the light-curable material at the second light-irradiation step allows a highly hermetic sealing to be attained, thereby enabling an electrooptical device that can exhibit desired performance to be manufactured by preventing the luminous element from being deteriorated. When the first region and second region are isolated with each other, the first region irradiated with a light in the first light-irradiation step accounts for less than 50% of the entire light-curable material disposed at the joint region. When the first region is considered to be a part of the second region, on the other hand, the first region irradiated with a light in the first light-irradiation step may account for less than 100% of the entire light-curable material (or second region) disposed at the joint region.

The first and second regions of the joint region are preferably defined based on the light irradiation range in steps (c) and (d).

The above steps desirably include:
- (e) exposing the first and second members after bonding to an atmosphere of a prescribed temperature for a prescribed period of time after step (d).

The light-curable material is completely hardened by allowing to stand still in an atmosphere of a prescribed temperature for a prescribed period of time, and the bonding force between the first member and second member is further reinforced. The UV-curable material is preferably used as the light-curable material, and the light irradiated to the first region and second region is preferably a UV light.

The present invention provides an apparatus of manufacturing an electrooptical device including a first member on which an electrooptical element is disposed, and a second member covering the electrooptical element. The manufacturing apparatus includes an adhesive material feed unit to feed an adhesive material to the first region and second region of a joint region to bond the first member and second member; a bonding unit to bond the first member and second member by use of the adhesive material; a first adhesive material hardening unit to harden the adhesive material fed on the first region of the joint region; and a second adhesive material hardening unit to harden the adhesive material fed on the second region of the joint region after hardening the adhesive material by the first adhesive material hardening unit.

It is desirable that the adhesive material feed unit includes a first feed unit to feed a first adhesive material to the first region of the joint region, and a second feed unit to feed a second adhesive material different from the first adhesive material to the second region of the joint region.

The first member and second member may be temporarily assembled with the first adhesive material in the present invention by feeding the first adhesive material capable of hardening within a short period of time to the joint region with the first feed unit, enabling the subsequent manufacturing steps to be efficiently performed. Hermetic sealing performance to the luminous element may be enhanced by feeding the second adhesive material having high hermetic sealing performance using the second feed unit, and the element is protected from being deteriorated. Consequently, the electrooptical device manufactured can exhibit its desired performance. It is also possible to simultaneously feed the first adhesive material and second adhesive material by taking advantage of the construction including two feed units in order to enhance productivity. Naturally, the feed unit is not necessarily required to include two units, and arbitrary number of plural, or three or more units, may be provided. The construction may comprise the first feed unit to feed the first adhesive material on the members and the second feed unit to feed the second adhesive material on the members, or include the first feed unit and second feed unit to feed the same adhesive on the members.

It is desirable that each of the first feed unit and second feed unit is independently movable relative to the joint region. Consequently, the first adhesive material and the second adhesive material be simultaneously fed without interference between the first feed unit and second feed unit, thereby enabling workability to be enhanced.

The manufacturing apparatus desirably includes a sensing unit to detect the distance between the joint region and each of the first and second feed apparatus, and an adjustment unit to adjust the positions of the first and second feed units based on the result of detection of the sensing unit. This construction of the apparatus enables each of the first feed unit and second feed unit to feed the adhesive materials from their enhanced or optimum positions to the joint region, and a desired adhesive material may be fed to a desired position of the joint region.

It is desirable in the manufacturing apparatus that the adhesive material feed unit is able to feed the adhesive material with a predetermined pattern, since a desired quantity of the adhesive material may be fed to the desired position of the joint region, thereby permitting bonding performance to be enhanced with efficient bonding by reducing or suppressing excessive use of the adhesive.

Desirably, the second region of the joint region is wider than the first region in the manufacturing apparatus described above, the adhesive material fed by the adhesive material feed unit is the light-curable material, and the first and second adhesive material hardening units include first and second irradiation units to irradiate a light having a wavelength capable of hardening each light-curable material.

According to the present invention, the light-curable material is disposed on the joint region by the adhesive material feed unit, and the light-curable material in the first region as a part of the light-curable material can be hardened within a short period of time by irradiating a light from the first irradiation unit. Consequently, the first member and second member may be temporarily assembled within a short period of time, and the waiting time of hardening may be shortened, thereby performing the subsequent manufacturing steps with good efficiency. The bonding force between the first member and second member may be reinforced by irradiating the light to the second region wider than the first region by the second irradiation unit to harden the light-curable material in the second region. Workability and productivity may be enhanced by independently providing the first light-irradiation unit to temporarily assemble the first member and second member by hardening a part of the light-curable material, and the second light-irradiation unit to harden the entire light-curable. A highly hermetic sealing ability may be attained by hardening the entire light-curable material using the second light-irradiation unit, so that an electrooptical device exhibiting desired performance may be manufactured by protecting the luminous element from being deteriorated.

The first light-irradiation unit includes a light source to emit a light, a shunting unit to shunt the light emitted from the light source, and an irradiation unit to irradiate the light shunted by the shunting unit to prescribed plural positions on the joint region. The first region of the joint region is desirably determined based on the prescribed position where the irradiation unit is able to irradiate the light.

Consequently, the light can be simultaneously irradiated to prescribed plural positions of the light-curable material fed to the joint region. Accordingly, temporary assembling of plural sites of the first and second members may be promptly effected using a simple construction of the apparatus, thereby enabling temporary assembling to be stabilized.

It is desirable that a holding unit capable of holding at least one of the first and second members is provided, and the irradiation unit is held with the holding unit. Consequently, the adhesive material may be hardened by irradiating a light while compressing, for example, the second member onto the first member with the holding unit.

The electrooptical device according to the present invention includes an electrooptical element, a first member to mount the electrooptical element, a second member to cover the electrooptical device, a first adhesive material fed to a first region in the joint region to bond the first member and second member to temporarily assemble the first member and second member, and a second adhesive material fed to the second region to bond in order to finally secure the first member and second member.

Desirably, the first adhesive material is a light-curable material, and the second adhesive material is a thermosetting material.

The electronic appliances according to the present invention include the electrooptical device according to the present invention.

BRIEF DESCRIPTION OF THE DRAWINGS

FIG. 16(a) shows a portable telephone, FIG. 16(b) shows an electronic watch, and FIG. 16(c) shows a portable information processor.

DETAILED DESCRIPTION OF PREFERRED EMBODIMENTS (First Exemplary Embodiment)

The first exemplary embodiment of the method of manufacturing the electrooptical device and manufacturing apparatus thereof, electrooptical device, and electronic appliances according to the present invention is described with reference to the drawings.

The electrooptical device according to the present invention is described herein using an organic EL device as an example.

Figure 1:
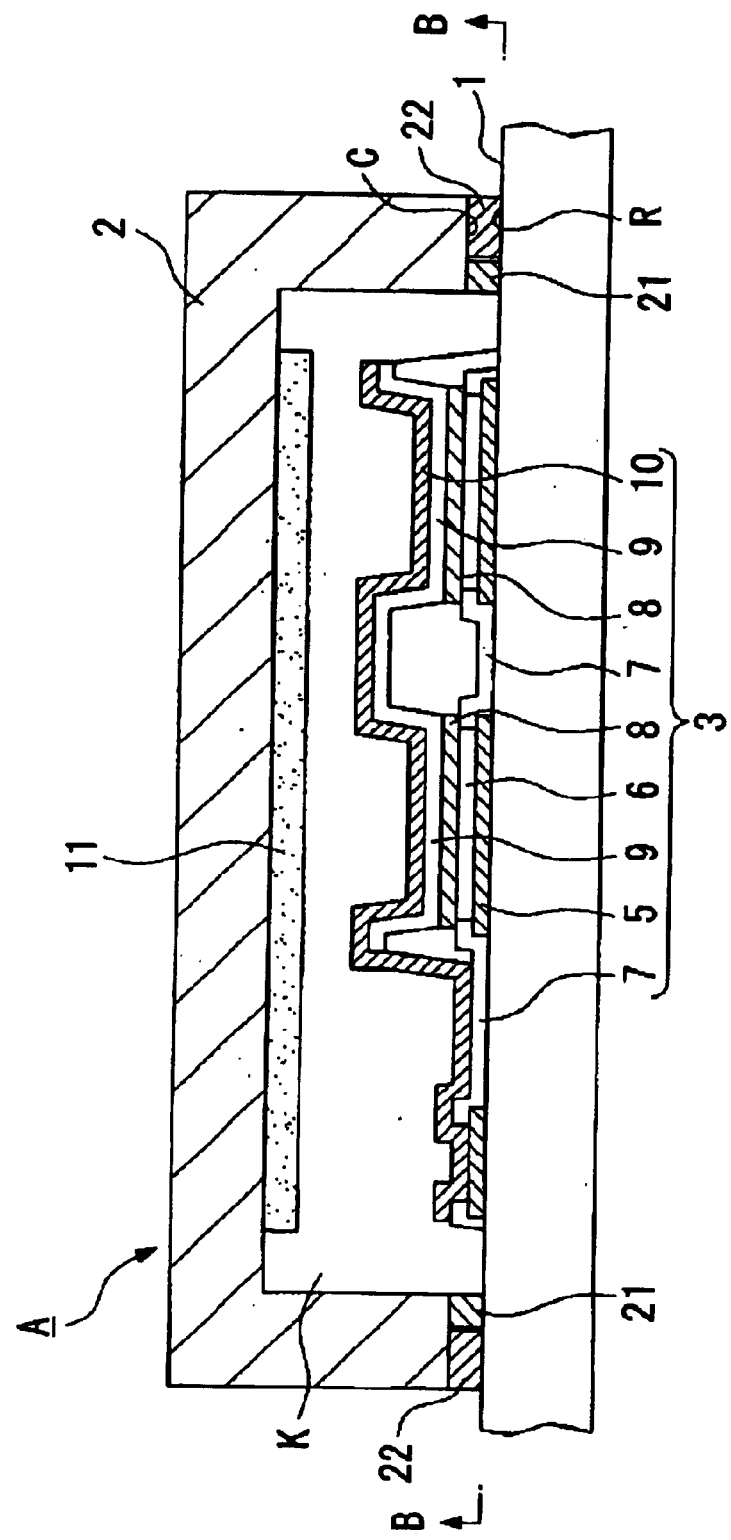
FIG. 1 is a cross-sectional view of a significant part of an exemplary embodiment of the electrooptical device according to the present invention.

FIG. 1 is a cross-sectional view of a significant part of the organic EL device (electrooptical device). In FIG. 1, the organic EL device (electrooptical device) A includes a substrate (first member) 1, a luminous element 3 disposed on the substrate 1, and a seal substrate (second member) 2 as a seal member to be bonded to the substrate 1.

The emitted light from the luminous element 3 is projected out of the device from the substrate 1 side in the organic EL device A shown in FIG. 1. The materials to form the substrate 1 is a light permeable transparent or semitransparent material, and examples of the material include transparent glass, quartz, and sapphire, and transparent synthetic resigns such as polyolefin, polyester, polyacrylate, polycarbonate and polyether ketone. Particularly, an inexpensive soda glass is favorably used as the material to form the substrate 1.

On the other hand, the substrate 1 may be opaque when the emitted light is projected out of the side opposed to the substrate 1, and a ceramic, such as alumina, and a metal sheet, such as a stainless steel sheet subjected to an insulation treatment, such as surface oxidation, a thermosetting resin, and a thermoplastic resin may be used.

The luminous element 3 includes an anode 5 formed on the substrate 1, a hole transfer layer 6, an insulation layer 7 formed so that a cathode 5 exposes the surface to be bonded to a positive hole transfer layer 6, an organic luminous layer 8, an electron transfer layer 9, and a cathode 10.

While the material of the anode 5 may include a single material, such as aluminum (Al), gold (Au), silver (Ag), magnesium (Mg), nickel (Ni), zinc-vanadium (ZnV), indium (In) and tin (Sn), a compound or mixture thereof, and a conductive adhesive containing a metallic filler, ITO (indium tin oxide) is used in this exemplary embodiment. While the anode 5 is preferably formed by sputtering, ion-plating or vacuum deposition, it may be formed by an wet process coating using a spin coater, photogravure coater and knife coater, or by screen printing and flexographic printing, for example. Light transmittance of the anode 5 is preferably adjusted to 80% or more.

The positive hole transfer layer 6 is formed with a thickness of 10 to 1000 nm (preferably 100 to 700 nm) by vacuum co-deposition of, for example, a carbazole polymer and TPD:triphenyl compound. The material of the positive hole transfer layer 6 is not particularly restricted, and any materials known in the art, of the related art, or that are later developed, may be used. Examples of the material include pyrazoline derivatives, arylamine derivatives, stilbene derivatives, and triphenyldiamine derivatives. Among the compounds disclosed in Japanese Unexamined Patent Application Publication Nos. 63-70257, 63-175860, 2-135359, 2-135361, 2-209988, 3-37992 and 3-152184, triphenyldiamine derivatives are preferable, and 4,4'-bis(N-(3-methylphenyl)-N-pehnylamino)biphenil is favorable.

A positive hole injection layer may be formed in place of the positive hole transfer layer 6, or both the positive hole injection layer and positive hole transfer layer may be formed. Examples of the materials used to form the positive hole injection layer include copper phthalocyanine (CuPc), polyphenylene vinylene as a polytetrahydrothiophenyl phenylene, 1,1-bis-(4-N,N-ditolylaminophenol)cyclohexane and tris(8-hydroxyquinolinol)aluminum, copper phthalocyanine (CuPc) is preferably used.

In another method, the positive hole transfer layer 6 is formed on the anode 5 by spraying a composite ink containing the materials to form the positive hole injection and transfer layers by the ink jet method on the anode 5 followed by drying and heat treatment. The positive hole transfer layer (positive hole injection layer) is formed on the anode 5 by drying and heat treatment after discharging the composite ink containing the material to form the positive hole transfer layer or positive hole injection layer on the surface of the anode 5. For example, the composite ink containing the material to form the positive hole transfer layer or positive hole injection layer is filled in an ink-jet head (not shown), discharge nozzles of the ink-jet head are placed opposite to the surface of the anode 5, and ink drops are sprayed on the surface of the anode from the spray nozzle with relative movement of the ink-jet head to the substrate 1 while controlling the volume of the ink per one drop. Then, polar solvents contained in the composite ink is evaporated by drying the ink drops after spraying to form the positive hole transfer layer (positive hole injection layer).

The composite ink available is prepared by dissolving a mixture of a polythiophene derivative, such as polyethylene dioxythiophene, and polystyrene sulfonic acid in a polar solvent, such as isopropyl alcohol. The discharged ink-drops are spread on the surface of the anode 5 subjected to an ink-phile treatment. On the contrary, the ink drops are repelled and do not adhere on the insulation layer 7 subjected to an ink repelling treatment. Accordingly, the surface of the insulation layer is not wet with the ink drops even when the ink drops missed to hit prescribed spray positions and sprayed on the surface of the insulation layer 7. The repelled ink drops roll down onto the anode 5.

The step of forming the positive hole transfer layer 6 and the subsequent steps are preferably performed in an inert gas atmosphere such as a nitrogen atmosphere or an argon atmosphere in order to prevent the positive hole transfer layer 6 and organic luminous layer 8 from being oxidized.

The insulation layer 7 is formed by depositing a silicon oxide layer or nitride layer on the entire surface of the substrate by a plasma CVD method using, for example, TEOS and oxygen gas as starting materials, and by patterning the layer by photolithography and etching.

The organic luminous layer 8 is also formed by the same method as forming the positive hole transfer layer 6, where the composite ink containing the material to form the luminous layer is discharged onto the positive hole transfer layer 6 by, for example, the ink jet method or the mask vacuum deposition method, followed by drying or heat-treatment. Examples of the material constituting the organic luminous layer 8 available include fluorene polymer derivatives, (poly)paraphenylene vinylene derivatives, polyphenylene derivatives, polyfluorene derivatives, polyvinyl carbazole, polythiophene derivatives, perylene dyes, coumarin dyes and rhodamine dyes, as well as low molecular weight organic EL materials and high molecular weight organic EL materials soluble in benzene derivatives. Examples of the materials suitable for the ink-jet method include paraphenylene vinylene derivatives, polyphenylene derivatives, polyfluorene derivatives, polyvinyl carbazole and polythiophene derivatives, and examples of the materials suitable for the mask vacuum deposition method include perylene dyes, coumarin dyes and rhodamine dyes.

To form the electron transfer layer 9, a metal complex compound formed from a metal and an organic ligand—preferably Alq3 (tris(8-quinolinolate)aluminum complex), Znq2 (bis(8-quinolinolate)zinc complex, Bebq2 (bis(8-quinolinolate)beryllium complex), Zn-BTZ (2-(o-hydroxyphenyl)benzothiazole zinc) and perylene derivatives—are laminated by vacuum evaporation to a thickness of 10 to 1000 nm preferably 100 to 700 nm).

The cathode 10 can be formed using a metal having a low work function enough to efficiently inject electrons into the electron transfer layer 9, and examples of the metal include pure metals, such as Ca, Au, Mg, Sn, In, Ag, Li and Al, an alloy thereof, or a compound thereof. The cathode includes two layers of a cathode layer mainly including Ca and a reflection layer mainly including Al.

The organic EL device A in this exemplary embodiment is an active matrix element, where a plurality of data lines and a plurality of scanning lines are aligned forming a lattice, and the luminous element 3 is connected to each pixel arranged into a matrix divided by these data lines and scanning lines through a driving TFT, such as a switching transistor and driving transistor, although such a wiring arrangement is not shown in the drawing. An electric current flows between the electrodes when driving signals are fed to the electrode through the data lines and scanning lines, a light emitted from the luminous element 3 is projected out of the transparent substrate 1, and the corresponding pixel is turned on. It is needless to say that the present invention is applicable not only to the active matrix display element but also to the passive driving display element.

The seal substrate 2 is provided to reduce or prevent air from invading into the luminous element 3 including the electrodes 5 and 10 from the outside, and is bonded to the substrate 1. Examples of the material to form the seal substrate 2 include transparent or semi-transparent materials, such as glass, quartz, sapphire and synthetic resin. Examples of the glass include soda lime glass, lead alkali glass, borosilicate glass, aluminosilicate glass and silica glass. Examples of the synthetic resin include transparent synthetic resins such as polyolefin, polyester, polyacrylate, polycarbonate and polyether ketone.

The seal substrate 2 is formed to have a shape having an opening (concave portion) open to the downward as viewed in cross-section, and a hermetic space K is formed between the flat substrate 1 and seal substrate 2 by bonding the external region (joint region) R of the surface of the substrate 1 where the luminous element 3 is provided, and the lower end face (joint region) C of the seal substrate 2. The luminous element 3 including the electrodes 5 and 10 is disposed in this hermetic space k. A drying agent 11 is provided at the hermetic space K side of the seal substrate 2. The luminous element 3 disposed in the hermetic space K is reduced or suppressed from being deteriorated by moisture by providing the drying agent 11.

The substrate 1 is bonded to the seal substrate 2 by use of a first adhesive (first material) 21 and second adhesive (second material) 22.

Figure 2:
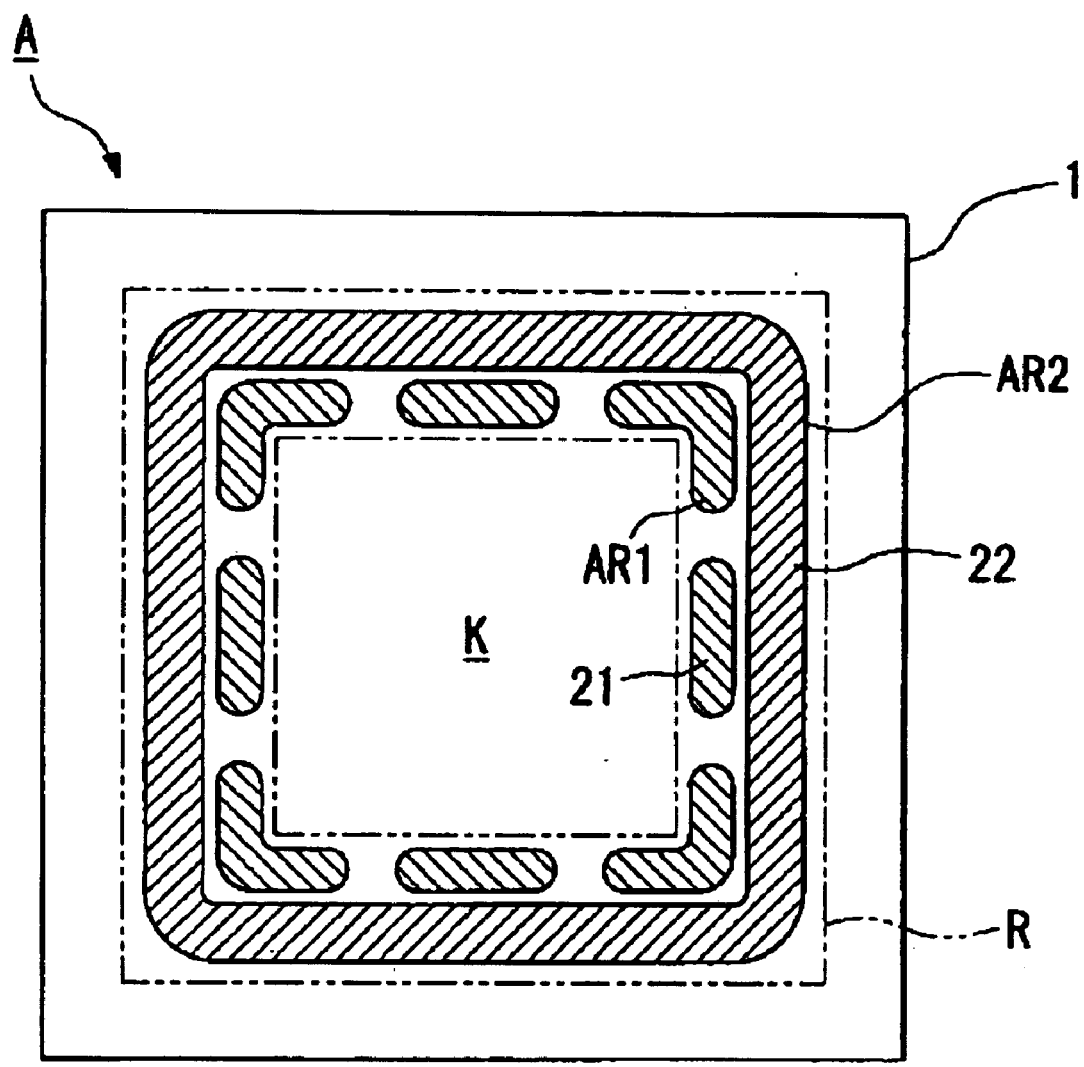
FIG. 2 is a cross-sectional view of the electrooptical device taken along plane B—B in FIG. 1.

FIG. 2 is a cross-sectional view as viewed in the direction of the arrow B—B in FIG. 1. As shown in FIG. 2, the first adhesive 21 and second adhesive 22 are arranged (including feeding on the surface of the joint region by coating, blowing and vacuum deposition hereinafter) at the joint region R to be bonded to the seal substrate 2 on the surface of the substrate 1. The first adhesive 21 is disposed at an inner region (first region) AR I of the joint region R having a square shape of a size smaller than the external square, and the second adhesive 22 is disposed at the external region (second region).

The first adhesive 21 is made of a material different from the material to form the second adhesive 22. The first adhesive 21 is a light-curable adhesive, and the second adhesive 22 is composed of a thermosetting adhesive.

The light-curable adhesive as a composition of the first adhesive 21 is a UV-curable adhesive that reacts with a UV light in the wavelength region of 200 to 400, and is hardened in a short period of time (for example 1 to 10 seconds) by irradiating the UV light. Examples of the UV-curable adhesive include radical adhesives taking advantage of radical polymerization such as acrylates including ester acrylate, urethane acrylate, epoxy acrylate, melamine acrylate and ether acrylate, and methacrylates; cationic adhesives taking advantage of cation polymerization such as epoxy compounds, vinylether compounds and oxithacene compounds; and thiol-ene addition resin adhesives. The cationic adhesives are preferable among them since they are not inhibited by oxygen, and polymerization reaction can advance after light irradiation. UV-curable epoxy adhesives of cation polymerization type are preferable as the cationic adhesives. The U-curable epoxy adhesive of cation polymerization type contains, as major photopolymerization initiators, Lewis salt curing agents that release a Lewis acid catalyst by photolysis by irradiating a light, such as UV light. The Lewis acid generated by light irradiation serves as a catalyst, oligomers comprising epoxy groups as major components are polymerized by a cation polymerization reaction mechanism, and the adhesive is hardened.

Examples of the epoxy compound as the principal component of the adhesive above include epoxylated olefin compounds, aromatic epoxy compounds, aliphatic epoxy compounds, alicyclic epoxy compounds and novolac epoxy compounds. Examples of the photopolymerization initiator include Lewis acid salts of aromatic diazonium, Lewis acid salts of diallyliodonium, Lewis acid salts of triallylsulfonium, and Lewis acid salts of triallylselenium. Inorganic fillers, such as clay minerals, whiskers and synthetic clay minerals may be further added for moisture reduction or prevention and viscosity adjustment, and a surfactant, such as a silane coupling agent, may be added for modification of inorganic filers and the surface of the substrate.

Substances in the related art, that are later developed, or known in the art, such as two-part adhesives using curing agents and adhesives using thermosetting materials, such as epoxy, amide-imide, phenol and melamine compounds, may be used as the thermosetting adhesive as the composition of the second adhesive 22. These adhesives are characterized in that a resin having a high cross-linking density and excellent moisture preventive property is readily obtained, since the adhesives are polymerized and hardened by taking advantage of heat dehydration condensation and activation of the functional group. The inorganic fillers and surfactant may be added as described above to obtain a moisture reduction or preventive property.

A spacer may be mixed with at least one of the first adhesive 21 and second adhesive 22, in order to maintain the seal substrate 2 at a prescribed elevation, for example at an elevation that prevents the seal substrate 2 from contacting or press-contacting with the organic EL structure. Mixing the spacer in the adhesive permits the elevation of the seal substrate 2 to be readily adjusted. Examples of the spacer include spherical or fibrous glass, quartz and resins, and fibrous glass is particularly preferable. The spacer may be previously mixed with the adhesive, or may be added during the bonding step.

Figure 3:
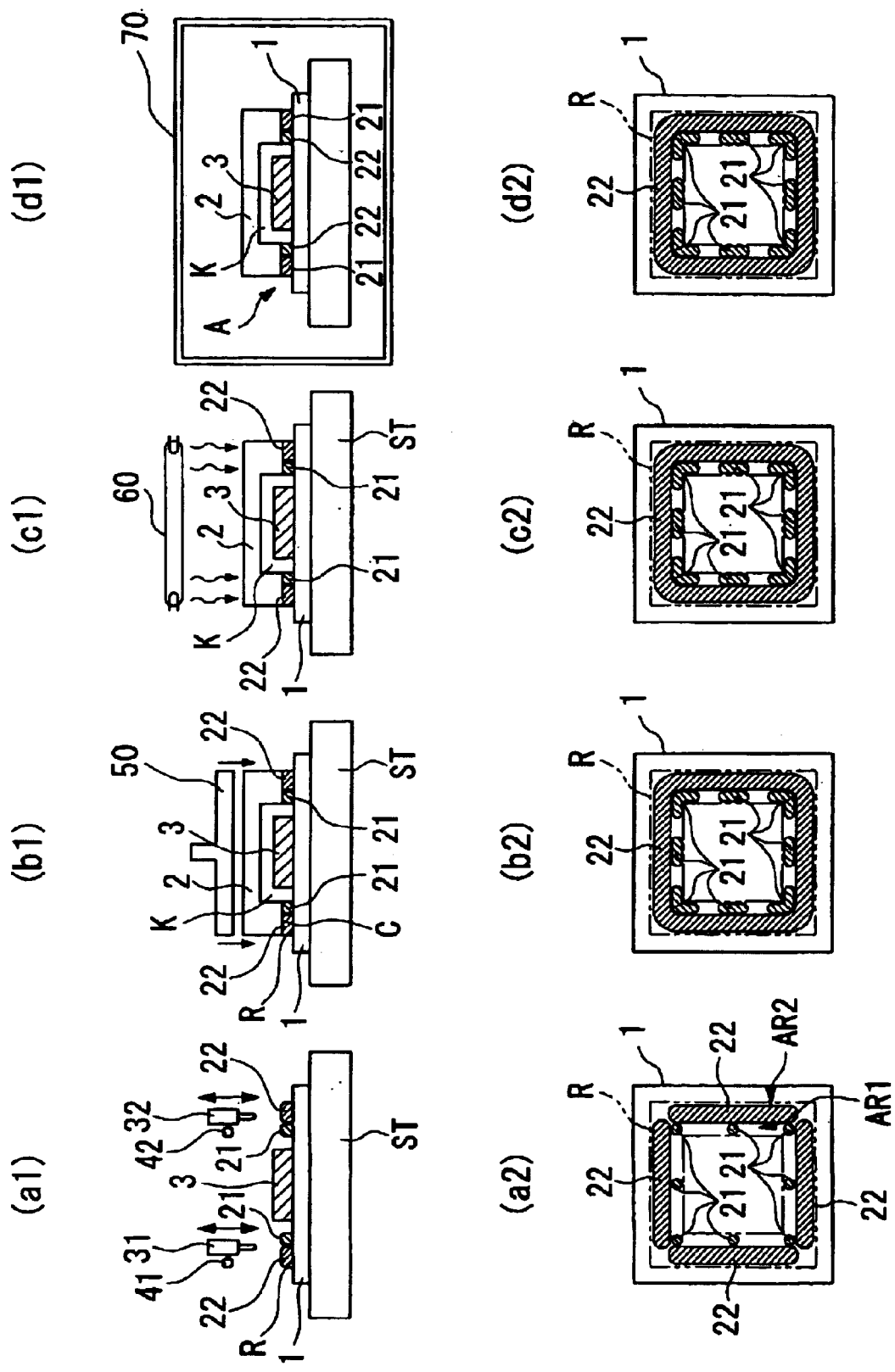
FIGS. 3($a$1)–3($d$2) are schematics showing an exemplary embodiment of the method of manufacturing the electrooptical device according to the present invention.

The step of bonding the substrate 1 and seal substrate 2 in the organic EL device A having the construction as described above is described hereinafter with reference to FIGS. 3(a1)–3(d2). FIGS. 3(a1) to 3(d1) are schematic cross-sectional views of each step, where FIGS. 3(a2) to 3(d2) show the surfaces of the substrate 1 in FIGS. 3(a1) to 3(d1), respectively.

Figure 4:
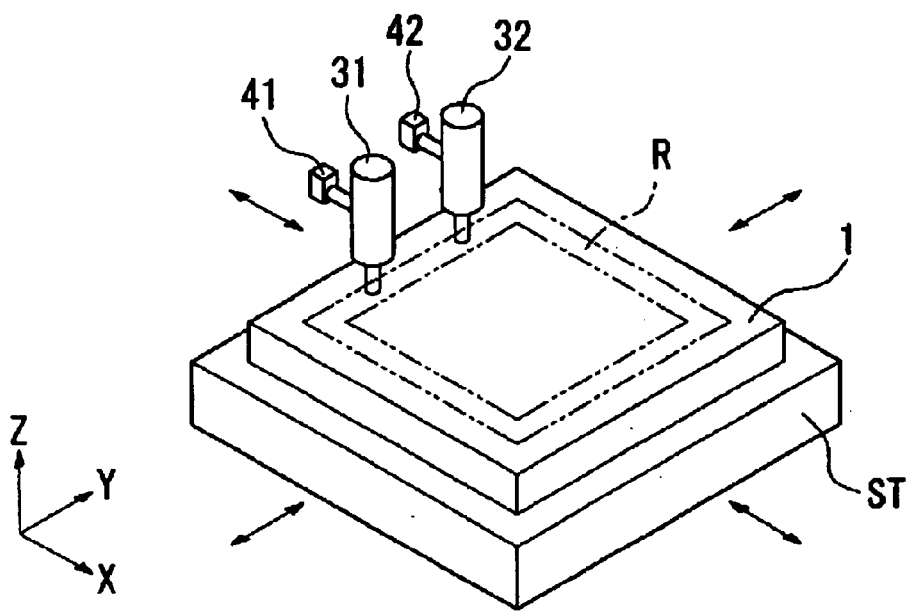
FIGS. 4($a$) and 4($b$) are schematics showing another exemplary embodiment of the method of manufacturing the electrooptical device according to the present invention.
Figure 4:
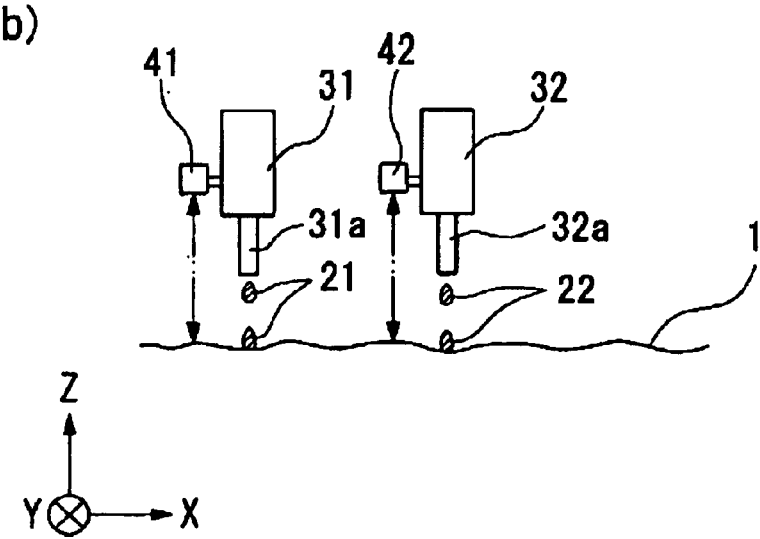

FIG. 4(a) is a schematic perspective view of an apparatus capable of bonding the substrate 1 and seal substrate 2 of the apparatus to manufacture the organic EL device A. The manufacturing apparatus includes a stage ST capable of holding the substrate 1, a first applicator 31 that is able to dispose the first adhesive 21 on the substrate 1 held with the stage ST, and a second applicator 32 that is able to dispose the second adhesive 22 on the substrate 1.

The bonding steps described hereinafter are carried out in an inert gas atmosphere, such as a nitrogen or argon atmosphere, in order to prevent the optical element 3 from being deteriorated or reduce such deterioration.

As shown in FIG. 3(a), the substrate 1 including the luminous element 3 including the anode and cathode is mounted on the stage ST. The stage ST is movable in the X-direction as one of the directions in a horizontal plane, Y-direction orthogonal to the X-direction in the plane, and in the Z-direction orthogonal to the X-and Y-directions. The stage ST can hold the substrate 1 by use of a vacuum chuck or electrostatic chuck. The first and second adhesives 21 and 22 are fed onto the substrate 1 mounted on the stage ST from the first and second applicators 31 and 32, respectively.

The first applicator 31 and second applicator 32 comprises dripping units capable of quantitatively discharging the first adhesive 31 and second adhesive 22, respectively, onto the substrate 1. The dripping unit can quantitatively discharge a fluid by quantitatively and periodically dripping the fluid. Accordingly, the adhesive discharged from each of the first applicator 21 and second applicator 32 should be a fluid.

The fluid is a medium having a viscosity capable of being discharged. (dripped) from the nozzle of the dripping unit. The fluid is only required to have enough fluidity (viscosity) capable of being discharged from the nozzle. The fluid includes a solution or dispersion of a material (adhesive in this case) in an organic solvent, or a material heated above the melting point of the material for making the material fluid. The fluid may be totally a fluid even when solid substances, such as the space as described above, are mixed in the fluid. A dye, pigment or other functional materials may be added to the solvent.

An example of the dripping unit is a dispenser unit and an ink-jet unit. For example, the adhesive may be adhered onto arbitrary positions of the substrate 1 with an arbitrary thickness using an inexpensive system by employing the ink-jet method as the application method of the adhesive.

The ink-jet method may be a piezoelectric method by which the fluid is discharged by volume changes caused by a piezoelectric element, or a method by which the fluid is discharged by rapidly allowing steam to be generated by heating.

The first applicator 31 and second applicator 32 are provided to be independently movable with each other relative to the substrate 1 mounted on the stage ST, and are movable in the X-, Y- and Z-directions. Furthermore, the discharge operations of the first applicator 31 and second applicator 32 are also independent with each other. Accordingly, the first applicator 31 and second applicator 32 are possible to dispose the first adhesive 21 and second adhesive 22, respectively, with respective prescribed patterns, by discharging each adhesive while independently traveling on the substrate 1 mounted on the stage ST.

The first applicator 31 and second applicator 32 comprises a first sensing unit 41 and second sensing unit 42, respectively, capable of detecting the distance from the surface of the substrate 1. Each of the first sensing unit 41 and second sensing unit 42 includes an optical sensor, where a sensing light is irradiated onto the substrate 1, and the distance from the substrate 1 can be detected by receiving the light reflected from the substrate 1 based on the sensing light. As shown in FIG. 4(b), each distance between each of the first applicator 31 and second applicator 32, and the substrate 1 in the Z-direction can be detected. The first and second applicators 31 and 32 can adjust respective positions in the height direction (Z-direction) with respect to the substrate 1 based on the detected results by the first and second sensing units 41 and 42, respectively, and the adhesives are discharged onto the substrate 1 from a proper elevation (elevation in the Z-direction). Consequently, damage of the substrate 1 is reduced or prevented by reducing or suppressing respective nozzles 31 a and 32a of the first and second applicators 31 and 32 and the substrate 1 from interfering with each other, even when the surface of the substrate 1 is rough. The first and second sensing units 41 and 42 may be secured to the first and second applicators 31 and 32, respectively, or may be independently provided to the first and second applicators 31 and 32. The sensing unit optically detects the distance between the tip of the nozzle of each applicator and the substrate 1, when the sensing unit is provided independently to the first or second applicator 31 or 32.

Each of the first and second applicators 31 and 32 dispenses the adhesive onto the prescribed joint region R on the substrate 1. The first applicator 31 dispenses the first adhesive 21 onto the prescribed region (first region) AR1 at the inner side of the joint region R, while the second applicator 32 dispenses the second adhesive 22 onto the prescribed region (second region) AR2 at the outside of the joint region R.

To dispose the adhesives, the first and second applicators 31 and 32 simultaneously apply the first and second adhesives 21 and 22, respectively, to the first and second regions AR1 and AR2, respectively, while the applicators are independently traveling with each other in the X-direction and Y-direction. The first and second applicators 31 and 32 apply (discharge) the adhesives while adjusting respective distances from the substrate 1 based on the detected results by the sensing units 41 and 42, respectively. Consequently, the first and second adhesives 21 and 22 are disposed with respective prescribed patterns, as shown in FIG. 3(a2).

As shown in FIG. 3(a2), the first applicator 31 discontinuously disposes the first adhesive 21 with a distance apart in the first area AR1. On the other hand, the second applicator 32 disposes the second adhesive 22 discontinuously at the edge, and continuously at the region other than the edge, in the second region AR2. In other words, the second adhesive 22 is disposed to be discontinuous at the edge of the second region AR2.

The adhesive may be applied while allowing the stage ST to travel to continuously apply the adhesive on the substrate 1. Alternatively, the adhesive may be applied with the second applicator 32 (or the first applicator 31) after completing the operation of the first applicator 31 (or the second applicator 32) without simultaneously operating the first and second applicators 31 and 32. In another method, the fist and second applicators 31 and 32 may be alternately operated.

Positioning marks (alignment marks not shown) provided on the substrate 1 may be used to provide positioning between the first applicator 31 and first region AR1. For example, the position of the alignment mark is optically detected using the alignment mark positional sensor, and the first applicator 31 is positioned with the first region AR1 whose position is definitely determined relative to the alignment mark based on the detected results. Likewise, positioning between the second applicator 32 and second region AR2 is possible using the alignment mark provided on the substrate 1.

After disposing the first and second adhesives 21 and 22 at the first and second regions AR1 and AR2, respectively, of the substrate 1, the seal substrate 2 is transferred onto the substrate 1 by use of a transfer unit 50 as shown in FIG. 3(b1). For example, the transfer unit 50 holds the seal substrate 2 by vacuum adsorption, and transfers it. The transfer unit 50 allows the bottom face C of the seal substrate 2 to contact the joint region R while positioning the bottom face C of the seal substrate 2 with the joint region R of the substrate 1 where the adhesives are disposed, and the substrate 1 is compressed onto the seal substrate 2 with a prescribed force.

The adhesives disposed on the joint region R is controlled to have a prescribed thickness after compression of the seal substrate 2 onto the substrate 1, and the application region is expanded as shown in FIG. 3(b2). This means that the first adhesive 21 disposed as a circle in the plan view before compression turns into an ellipsoidal shape in the plan view. The amount and position of application of the first adhesive 21 before compression are previously adjusted to be enhanced or optimum so that the first adhesive 21 does not flow out of the joint region R and bottom face C after compression.

Likewise, the second adhesive 22 that has been applied so as to be discontinuous at the edge of the second region AR2 before compression is made to be continuous at the edge after compression. Communication of gases between the hermetic space K and the outside thereof is blocked by allowing the second adhesive 22 to be continuous after compression. The amount and position of application of the second adhesive 22 before compression is previously determined to be optimum so that the second adhesive 22 does not flow out of the joint region R and bottom face C after compression, and so that the discontinuous part becomes continuous after compression.

Since the gas in the space formed between the substrate 1 and seal substrate 2 by compression is discharged to the outside through the discontinuous portions provided in the second adhesive 22 before compression, the inner pressure of the space is reduced or suppressed from increasing, and the substrate 1 and seal substrate 2 are reduced or prevented from slipping out of position to stabilize the compressed state between the substrates. In addition, communication of the gas between the hermetic space K and the outside thereof is blocked by allowing the second adhesive 22 to be continuous in the entire second region AR2 after compression.

After the substrate 1 is bonded to the seal substrate 2 with interposition of the first and second adhesives 21 and 22, a light irradiation treatment (first treatment) is applied by irradiating a light having a prescribed wavelength to the first adhesive 21 from a light source 60 as shown in FIG. 3(c1). The light source 60 emits a UV light with a wavelength of, for example, 360 nm. The first adhesive 21 as the UV-curable adhesive is hardened within a short period of time by the UV light from the light source 60. The substrate 1 and seal substrate 2 are thus temporality assembled using the first adhesive 21. The amount of application of the first adhesive 21 is controlled to be smaller than the amount of application of the second adhesive 22 in order to shorten the temporary assembling step. For example, the amount of application of the first adhesive 21 is adjusted to be enhanced or optimum in order to complete temporary assembling within a time period as short as possible, and in order to reduce or prevent the substrate 1 and seal substrate 2 from being peeled or slipping out of position.

After temporarily assembling the substrate 1 and seal substrate 2 with the first adhesive 21, the organic EL device A is placed in a heating chamber 70 as shown in FIG. 3(d1). A heating treatment (second treatment) to heat the second adhesive 22 is performed in the heating chamber 70. The second adhesive 22 as a thermosetting adhesive is hardened by the heat-treatment. Since the amount of application of the second adhesive 22 is adjusted to be larger than that of the first adhesive 21 so as to be continuously disposed in the second region AR2, bonding force between the substrate 1 and seal substrate 2 is enhanced while enhancing the sealing ability of the hermetic space K.

The substrate 1 and seal substrate 2 may be temporarily assembled with the first adhesive 21 within a short period of time, by disposing the first adhesive 21 curable within a short period of time by UV irradiation in the first region AR1 of the joint region R while disposing the second adhesive 22 curable by heating at the second region AR2 different from the first region AR1. Consequently, the subsequent steps (such as transfer step) may become possible by shortening the waiting time to harden the adhesive while reducing or preventing the substrate 1 and seal substrate 2 from slipping out of position. Employing a thermosetting adhesive having a high sealing ability as the second adhesive 22 permits an organic EL device A having high sealing performance to be manufactured using the second adhesive 22. Consequently, the organic EL device A is able to exhibit desired performance such as long service life and high recognition of vision.

Since the bonding step is performed in an inert gas atmosphere to the luminous element 3, such as a nitrogen or argon atmosphere, the luminous element 3 is protected from being deteriorated in the manufacturing steps.

Since the first or second adhesive 21 or 22 is applied by providing discontinuous portions of the adhesive in the step before compression, the pressure in the space formed between the substrate 1 and seal substrate 2 may be increased in the compression step of the second substrate 2 onto the substrate 1, and the substrate 1 and seal substrate 2 may slip out of position by pressure increase. However, the gases in the space can be discharged through the discontinuous portions by discontinuously disposing the adhesive before compression, thereby enabling slipping out of position due to the pressure increase in the space to be prevented or reduced.

The first and second applicators 31 and 32 to apply the first and second adhesives 21 and 22, respectively, are provided to be independently movable relative to the substrate 1, and the adhesives are independently discharged with each other. Consequently, the first and second applicators 31 and 32 can apply the first and second adhesives 21 and 22, respectively, with desired patterns and amounts of application within a short period of time, thereby enabling adhesive property and productivity to be enhanced.

The sensing units 41 and 42 capable of detecting the distances between the joint region R of the substrate and the first and second applicators 31 and 32, respectively, are provided, and the positions of the first and second applicators 31 and 32 in the height direction are adjusted based on the detected results of the sensing units 41 and 42, respectively. Consequently, the first and second applicators 31 and 32 are possible to discharge the adhesives from respective enhanced or optimum elevations to the joint region R, and an enhanced or optimum amount of the adhesive can be disposed at each desired position of the joint region R.

While the adhesive is applied on the joint region R of the substrate 1 in the exemplary embodiments above, it is needless to say that the substrate 1 may be bonded to the seal substrate 2 after applying the adhesive on the lower face C of the seal substrate 2.

The first adhesive 21 was the UV-curable adhesive, and the second adhesive 22 was the thermosetting adhesive in the exemplary embodiments above. However, any adhesives capable of bonding the substrate 1 and seal substrate 2 may be used, and an EB (electron beam) curable material and two component curable material capable of hardening within a short period of time may be used as the first adhesive 21.

Figure 5:
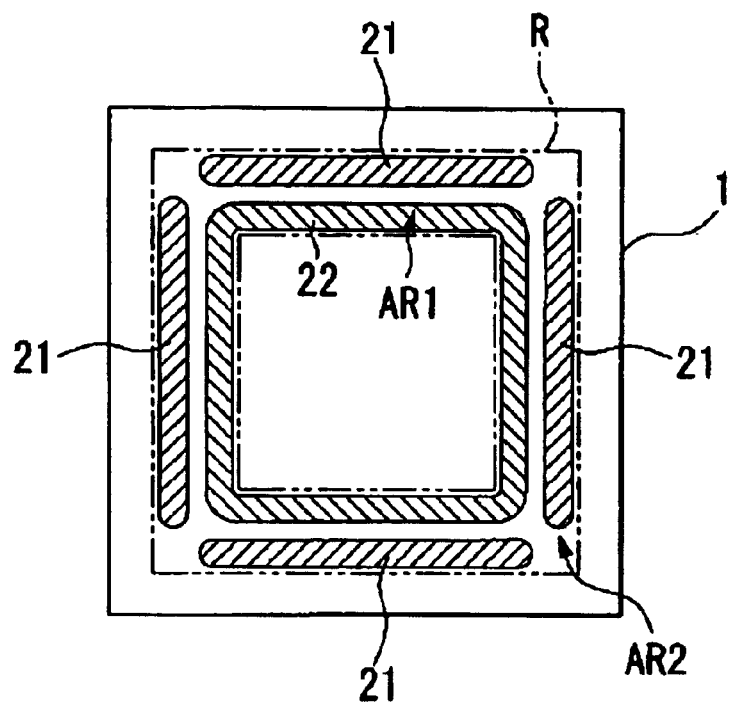
FIG. 5 is a schematic of a different exemplary embodiment of the present invention showing an upper view of the first member.

The first adhesive 21 is disposed on the inner region AR1 of the joint region R, and the second adhesive 22 is disposed on the outer region AR2 of the joint region R in the embodiments above. However, the second adhesive 22 may be disposed on the inner region AR1 of the joint region R, and the first adhesive 21 may be disposed on the outer region AR2 of the joint region R, as shown in FIG. 5.

While the discontinuous portions of the second adhesive 22 is provided at the edge of the second region AR2, the position is not restricted to the edge, and may be provided at the peripheral regions. This means that the patterns to dispose the first and second adhesives 21 and 22 are able to be arbitrarily determined.

Figure 6:
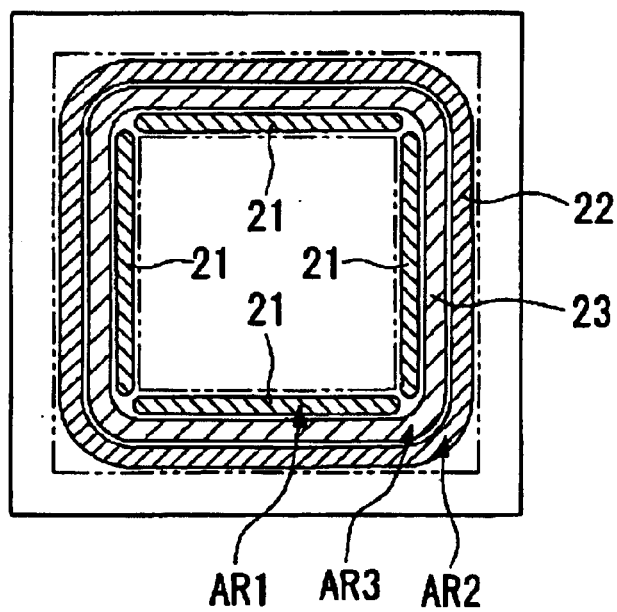
FIG. 6 is a schematic of a further different exemplary embodiment of the present invention showing an upper view of the first member.

A third material 23 may be disposed between a region (third region) AR3 between the first adhesive 21 and second adhesive 22 in the joint region R as shown in FIG. 6 in order to bond the substrate 1 and seal substrate 2. FIG. 6 shows the upper view of the substrate 1 after compressing the seal substrate 2 onto the substrate 1. Any adhesives capable of bonding the substrate 1 and seal substrate 2 may be used for the third material 23, which may be an arbitrary synthetic resin such as polyacrylate, polymethacrylate, polyester, polyethylene and polypropylene, and a combination thereof A hygroscopic material may be preferably used as the material to form the third material 23, since the material is able to reduce or block moisture from invading into the luminous element 3 to enable the element to be further reduced or prevented from being deteriorated. The position to dispose the third material 23 is not restricted between the first and second adhesives 21 and 22, and the position is arbitrary in the joint region R, such as the inside of the first adhesive 21 and outside of the second adhesive 22.

The technical scope of the invention is not restricted to the exemplary embodiments above, and various modifications are possible without departing from the spirit of the present invention.

For example, while the hermetic space K is a cavity in the exemplary embodiment above, prescribed materials, such as a synthetic resin, may be disposed in the hermetic space K.

While the exemplary embodiment above has been described with reference to the luminous element 3 in which the emitted light is projected out of the external face side through the substrate 1, the present invention is applicable to the luminous element in which the emitted light is projected out of the cathode 10 side opposed to the substrate 1 through the seal substrate 2. A transparent or semi-transparent material capable of permeating the light is used for the seal substrate 2 in this case.

UV light is supposed to adversely affect the luminous element 3 by irradiating the UV light from above for hardening the first adhesive 21, when the seal substrate 2 is made of the transparent material. Accordingly, a light-shielding mask may be provided at the position corresponding to the luminous element 3 such as the central region of the seal substrate 2 when the UV light is irradiated, so that only the region AR1 where the first adhesive 21 is disposed is irradiated with the UV light.

The adhesives are applied by adjusting the distances between the first and second applicators 31 and 32 and the substrate 1, respectively, based on the detected results by the first and second sensing units 41 and 42, respectively, in the exemplary embodiment above. Alternatively, the surface configuration of the substrate 1 may be previously detected (without application of the adhesive) using the first and second sensing units 41 and 42, and the detected results are stored in a memory. Then, the adhesives may be coated while adjusting the elevation of the first and second applicators 31 and 32 based on the stored results.

(Second Exemplary Embodiment)

Figure 7:
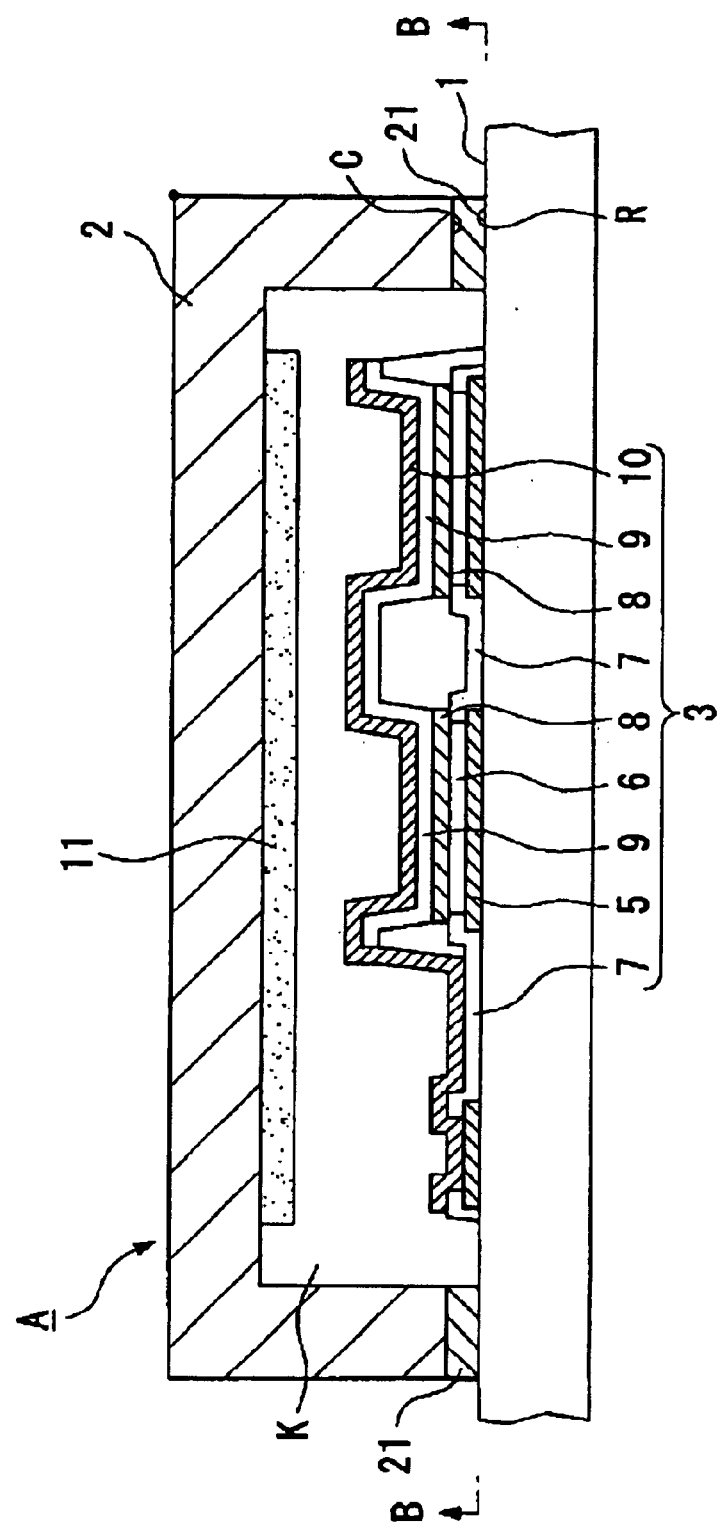
FIG. 7 is a cross-sectional view of a significant part of a further different exemplary embodiment of the electrooptical device according to the present invention.

FIG. 7 shows a cross-section of the major part of the organic EL device (electrooptical device) according to the second exemplary embodiment of the present invention. In FIG. 7, the organic EL device (electrooptical device) A includes a substrate (first member), a luminous element 3 disposed on the substrate 1, and a seal substrate (second member) 2 as a seal member to be bonded to the substrate 1.

The organic EL device in this exemplary embodiment differs from the organic EL device in the first exemplary embodiment in that the substrate 1 and seal substrate 2 are bonded with each other only by the first adhesive 21 (simply named as the adhesive 21) without using the second adhesive 22. Since other parts are identical with each other, descriptions thereof are omitted.

Figure 8:
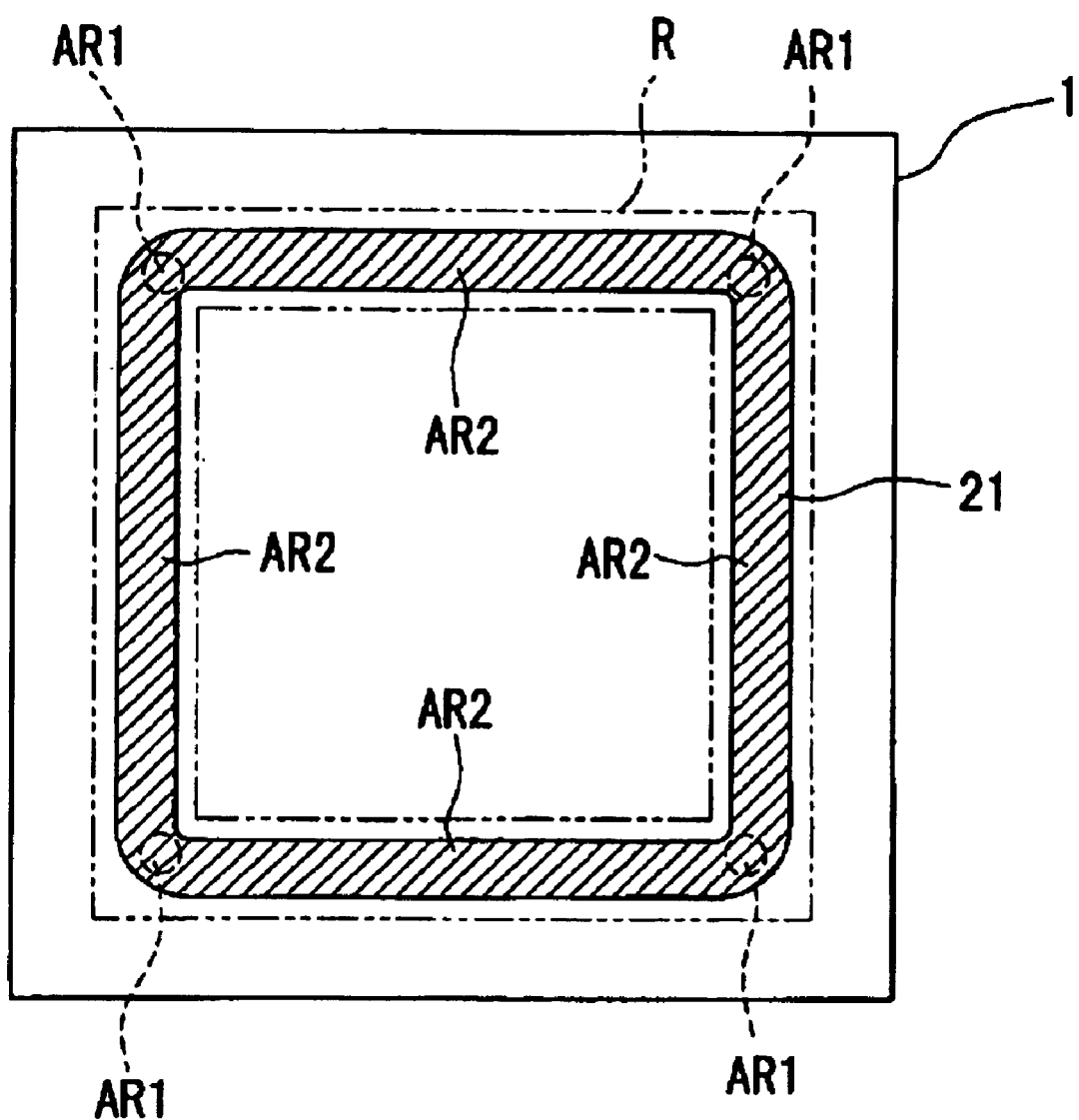
FIG. 8 is a cross-sectional view of the electrooptical device taken along plane B—B in FIG. 7.
Figure 9:
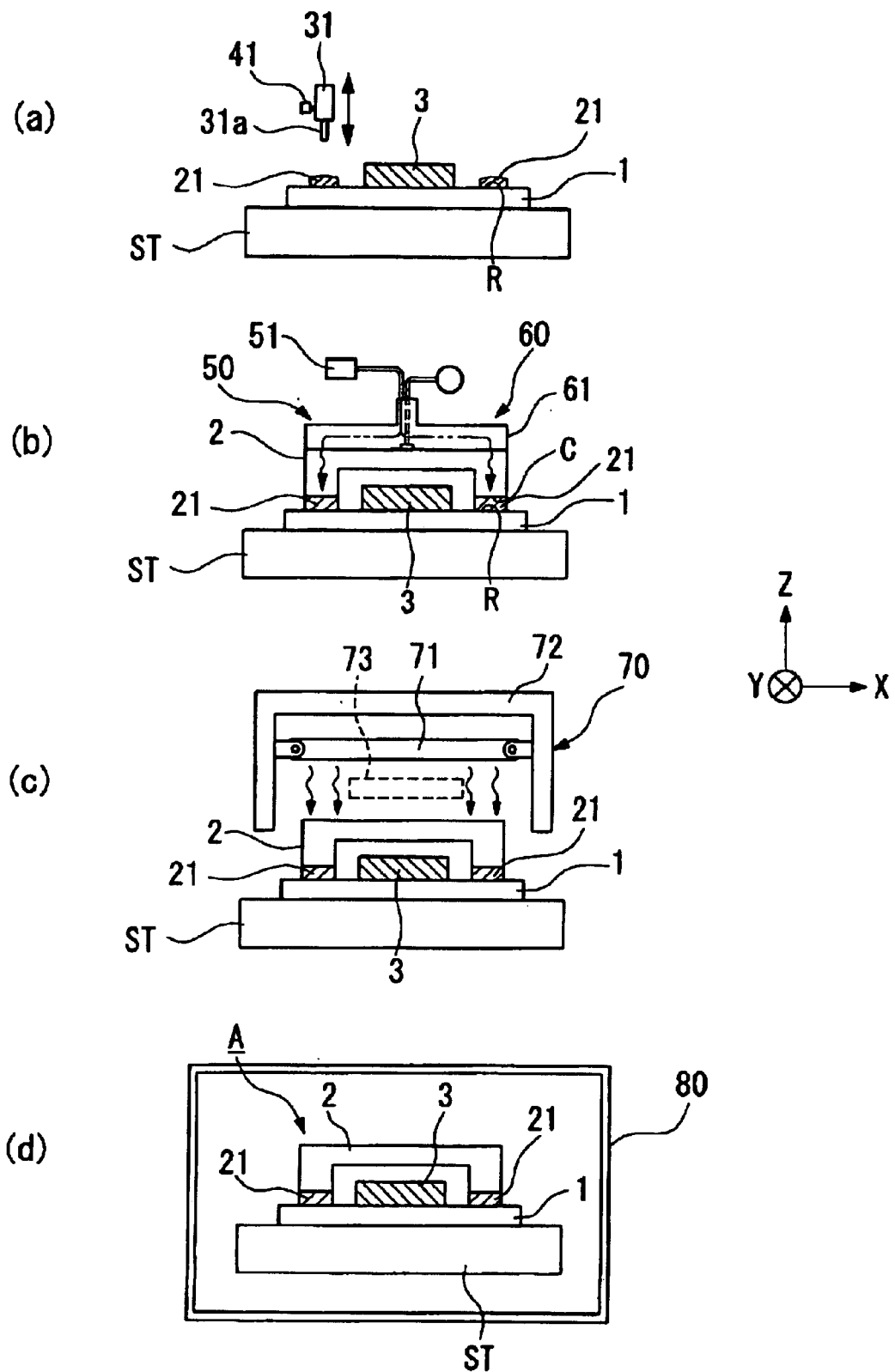
FIGS. 9($a$)–9($d$) are schematics showing a further different exemplary embodiment of the method of manufacturing the electrooptical device according to the present invention.

FIG. 8 is a cross-sectional view taken along Plane B—B in FIG. 7. As shown in FIG. 8, the adhesive 21 is disposed in the joint region R to be bonded with the seal substrate 2 on the surface of the substrate 1. The adhesive 21 is disposed so as to be continuous over the entire joint region R.

The adhesive 21 includes a light-curable adhesive (light-curable material). An example of the light-curable adhesive constituting the adhesive 21 is a UV-curable adhesive that reacts with a UV light in the wavelength region of 200 to 400 nm, and is hardened within a short period of time (for example within 1 to 10 seconds) by irradiating the UV light. Examples of the UV-curable adhesive include radical adhesives utilizing radical polymerization acrylates such as ester acrylate, urethane acrylate, epoxy acrylate, melamine acrylate and ether acrylate, and methacrylates; cationic adhesives utilizing cation polymerization such as epoxy compounds, vinylether compounds and oxithacene compounds; and thiol-ene addition resin adhesives. The cationic adhesives is preferable among them since it is not inhibited by oxygen and the polymerization reaction is advanced after irradiating with the light. The preferable cationic adhesives include the cation polymerization UV-curable epoxy adhesives. The cation polymerization UV-curable epoxy adhesive contains a Lewis acid salt curing agent that releases a Lewis acid catalyst by photolysis by irradiation of the UV light as a major photopolymerization initiator. An oligomer having epoxy groups as the major component is polymerized by a cation polymerization reaction mechanism using the Lewis acid generated by light irradiation as the catalyst, and the adhesive is hardened.

Examples of the epoxy compounds as the major component of the adhesive include epoxylated olefin compounds, aromatic epoxy compounds, aliphatic epoxy compounds, alicyclic epoxy compounds and novolac epoxy compounds. Examples of the photopolymerization initiator include Lewis acid salts of aromatic diazonium, Lewis acid salts of diallyliodinium, Lewis acid salts of triallysulfonium, and Lewis acid salts of triallylselenium. A heat-curing treatment may be applied to further enhance the cross-linking density by hardening to an extent not to damage the organic EL element. It is recommended to apply the heat treatment after the epoxy compound has been polymerized with the photopolymerization initiator by irradiating the UV light and they have not been evaporated as low molecular weight gases.

Inorganic fillers (clay minerals and super-fine particles) with a particle diameter of 5 $\mu$m or less are added in a proportion of 70 wt % or less considering viscosity adjustment and moisture preventive property in the acrylic radical polymerization adhesive or epoxy cationic polymerization adhesive in this exemplary embodiment, and spherical or needle-like spacers (inorganic acid compounds) with a particle diameter of 4 to 10 $\mu$m are further added in a range of 0.5 to 5.0 wt % for controlling the thickness. A surfactant, such as a silane coupling agent, may be added to enhance dispersing ability of these inorganic materials in the adhesive component.

A UV light permeable glass (preferably non-alkaline glass) is used as the seal substrate 2 in this exemplary embodiment, where the lower face C of the glass used in contact with the adhesive 21 has a surface roughness Ra (arithmetic mean surface roughness) of 1 $\mu$m or less and Rmax (maximum height) of the roughness of 3 $\mu$m or less. The concave region (at the seal space K side) of the seal substrate 2 is engraved to a depth of 0.3 to 0.6 mm by sandblast or grinding of the flat glass.

The step of bonding the substrate 1 and seal substrate 2 in the organic EL device A having the construction as described above is described hereinafter with reference to FIGS. 9(a)–9(d).

A manufacturing apparatus including a stage ST capable of supporting the substrate 1, an applicator 31 capable of disposing the adhesive 21 onto the substrate 1 supported by the stage ST, a first irradiation unit 50 capable of projecting a light having a prescribed wavelength, and a second irradiation unit 70 capable of projecting a light having a prescribed wavelength is used for the bonding step described hereinafter. The bonding step described hereinafter is performed in an inert gas atmosphere, such as a nitrogen or argon atmosphere, to protect the luminous element 3 from being deteriorated.

As shown in FIG. 9(a), the substrate 1 including the luminous element 3 including the anode and cathode is mounted on the stage ST. The stage ST is movable in the X-direction as a direction in the horizontal plane, in the Y-direction orthogonal to the X-direction in the horizontal plane, and in the Z-direction orthogonal to both X- and Y-directions. The stage ST holds the substrate 1 by use of a vacuum chuck or electrostatic chuck. The adhesive 21 is disposed onto the substrate 1 mounted on the stage ST from the applicator 31.

The applicator 31 includes a dripping unit capable of quantitatively dripping the adhesive 21 onto the substrate 1. The dripping unit is able to quantitatively discharge a fluid to quantitatively and intermittently drip the fluid. Accordingly, the adhesive to be dripped from the applicator 21 as the dripping unit is a fluid.

The fluid is a medium having a viscosity capable of discharging (dripping) out of nozzles of the dripping unit. The fluid has fluidity (viscosity) enough to discharge out of the nozzles, and includes a solution or dispersion of the material (the adhesive in this case) in an organic solvent, or a material heated above the melting point of the material to make the material fluid. The material may be a fluid as a whole even by mixing solid substances, such as spacers, in the fluid as described above. A dye and pigment, or other functional substances other than the solvent, may be added in the fluid.

Examples of the dripping unit include a dispenser and ink-jet unit. For example, the adhesive may be adhered onto arbitrary positions of the substrate 1 with an arbitrary thickness using an inexpensive system by employing the ink-jet method as the application method of the adhesive. The ink-jet method may be a piezoelectric method by which the fluid is discharged by volume changes caused by a piezoelectric element, or a method by which the fluid is discharged by rapidly allowing steam to be generated by heating.

The applicator 31 is provided so as to be movable relative to the substrate 1 mounted on the stage ST in the X-, Y- and Z-directions. Accordingly, the applicator 31 is able to dispose the adhesive 21 with a prescribed pattern by discharging the adhesive while traveling relative to the substrate 1 mounted on the stage ST.

The stage ST side may be moved to apply the adhesive on the substrate 1.

The applicator 31 includes a sensing unit 41 capable of detecting the distance between the surface of the substrate 1 and the applicator. The sensing unit 41 is composed of an optical sensor. A sensing light is irradiated onto the substrate 1, and the distance between the substrate 1 and the applicator is detected by receiving the light reflected from the substrate 1 based on the irradiated sensing light, or the distance between the substrate 1 and the applicator 31 in the Z-direction is able to be detected. The applicator 31 is possible to adjust the position in the height direction (Z-direction) from the substrate 1 based on the detected results of the sensing unit 41, and the adhesive is dripped onto the substrate 1 from an optimum elevation (the position in the Z-direction). Consequently, the substrate 1 is protected from being damaged by reducing or suppressing the nozzle 31 a of the applicator 31 and substrate 1 from interfering with each other, even when the surface of the substrate is rough. The sensing unit 41 may be secured to the applicator 31, or may be independently provided from the applicator 31. The sensing unit optically detects the distance from the tip of the nozzle of the applicator and substrate 1 in the structure in which the sensing unit is provided independently from the applicator 31.

The applicator 31 dispenses the adhesive 21 onto the joint region R previously determined on the substrate 1. The adhesive 21 is applied on the joint region R while allowing the applicator 31 to travel in the X- and Y-directions to dispose the adhesive 21. The applicator 31 applies (discharges) the adhesive while adjusting the distance between the substrate 1 and sensing unit based on the detection results of the sensing unit 41. The adhesive 21 is thus disposed with a prescribed pattern.

Figure 10:
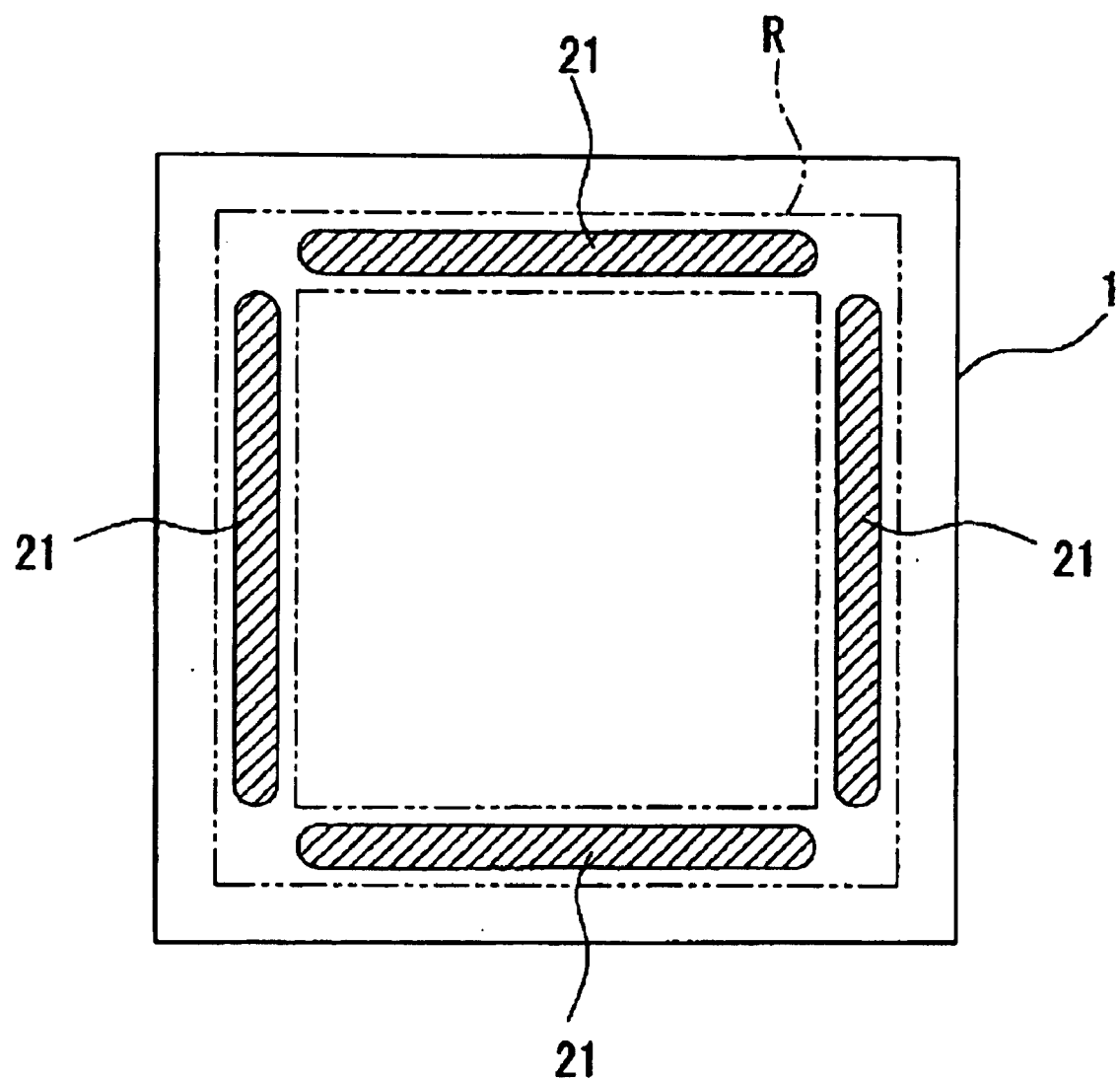
FIG. 10 is a schematic that shows the light-curable material disposed in the bonding region by an applicator.
Figure 10:
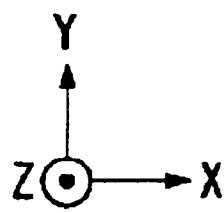

The applicator 31 disposes the adhesive 21 so that it is discontinuous at the edge of the joint region R, and continuous in the region other than the edge, as shown in FIG. 10. In other words, the adhesive 21 is disposed to be discontinuous at the edge of the joint region R.

It is possible to position the applicator 31 and junction region R by taking advantage of a positioning mark (alignment mark not shown) provided on the substrate 1. For example, the position of the alignment mark is detected by a sensor (not shown) to detect the alignment mark position, and the applicator 31 is positioned with the joint region R definitely determined relative to the alignment mark.

After disposing the adhesive 21 on the joint region R of the substrate 1, the seal substrate 2 is transferred onto the substrate 1 by use of a holding unit 60. The holding unit 60 makes contact with the bottom face C with the joint region R while positioning the bottom face C of the seal substrate 2 to the joint region R of the substrate 1 on which the adhesive 21 is disposed, and the seal substrate 2 is compressed onto the substrate 1 with a prescribed strength. Then, a light (UV light) having a prescribed wavelength is irradiated to the adhesive 21 from the first irradiation unit 50.

Figure 11:
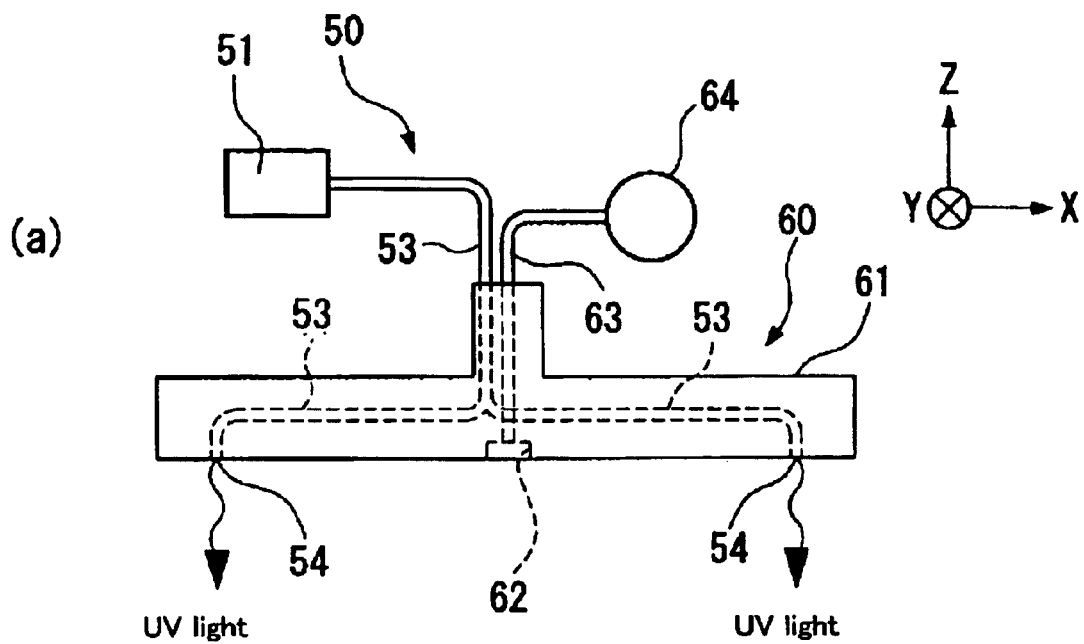
FIGS. 11($a$) and 11($b$) are schematics showing the first irradiation unit and holding unit of the apparatus of manufacturing the electrooptical device according to the present invention.
Figure 11:
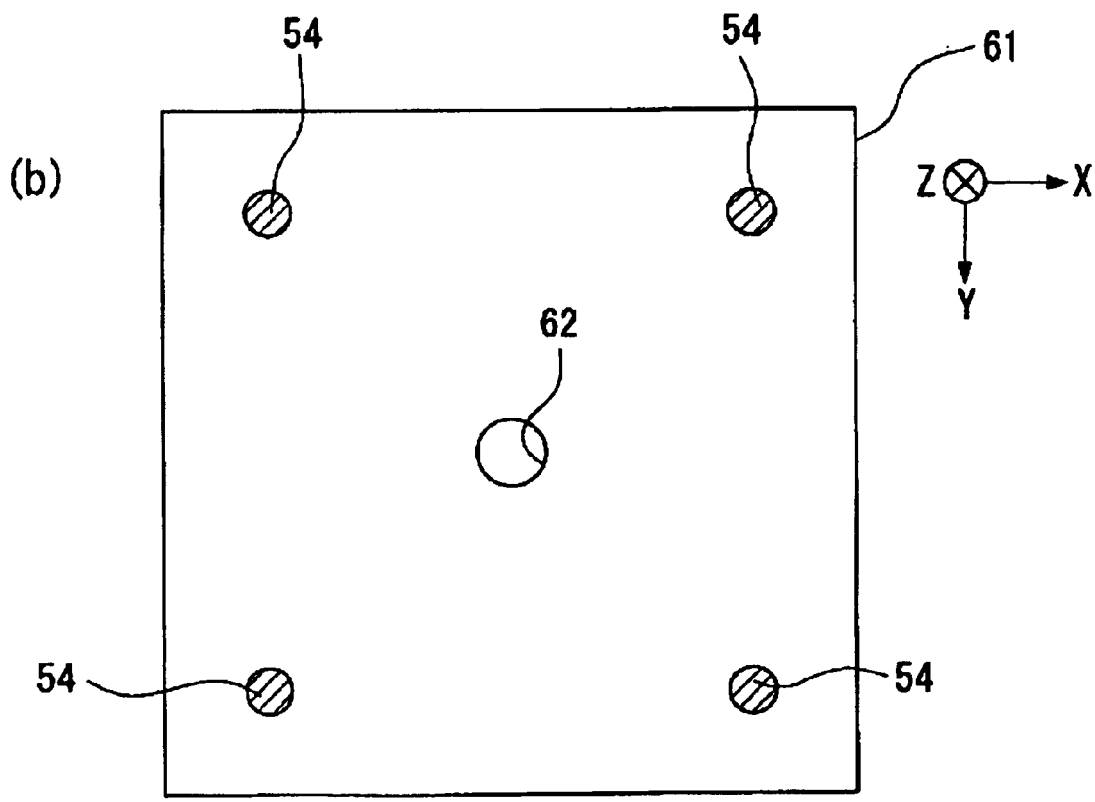

The first irradiation unit 50 and holding unit 60 is described with reference to FIGS. 11(*a*) and 11(*b*). FIG. 11(*a*) is a side view of the first irradiation unit 50 and holding unit 60, and FIG. 11(*b*) is a bottom view (from the inverse direction to the Z-direction) of the units in FIG. 11(*a*).

As shown in FIGS. 11(*a*) and 11(*b*), the first irradiation unit 50 includes a light source 51 to project a UV light, and optical fibers (shunt unit) 53 to guide the UV light from the light source 51 to an irradiation port 54 provided on the bottom face of the holding plate 61 of the holding unit 60. A plurality of the irradiation ports 54 capable of projecting the UV light from the light source 51 are provided at plural sites of the holding plate 61. The irradiation ports 54 are provided at four corners of the rectangular holding plate 61 in the plane view as shown in FIG. 11(*b*). The optical fiber 53 is provided to shunt the UV light projected out of one light source 51 into plural irradiation ports 54. The UV light emitted from the light source 51 is projected out of the plural irradiation ports 54 through the optical fiber 53.

The holding unit 60 includes the holding plate 61 that is able to make contact with the upper surface of the seal substrate 2, an adsorption hole 62 provided on the bottom face of the holding plate 61, and a vacuum pump (adsorption unit) 64 connected to the adsorption hole 62 through a flow conduit 63. The adsorption hole 62 is provided approximately at the center of the bottom face of the holding plate 61 in this exemplary embodiment. The holding unit 60 permits the holding plate 61 to contact the seal substrate 2, and holds and transfers the seal substrate 2 by vacuum adsorption through the adsorption hole 62 by operating the vacuum pump 64.

The holding unit 60 may include other methods and apparatus, such as an electrostatic chuck to hold the seal substrate 2.

Returning now to FIG. 9(*b*), the holding unit 60 allows the bottom face C to contact the joint region R while positioning the bottom face C of the seal substrate 2 with the joint region R of the substrate 1 on which the adhesive is disposed, and the seal substrate 2 is compressed onto the substrate 1 with a prescribed force.

The adhesive 21 disposed on the joint region R is adjusted to have a prescribed thickness by compression of the seal substrate 2 onto the substrate 1 in order to expand the application region. In other words, the adhesive 21 applied so as to be discontinuous at the edge of the joint region R before compression as shown in FIG. 10 becomes continuous at the edge after compression as shown in FIG. 8. Communication of a gas between the hermetic space K and external space thereof is blocked by forming the adhesive 21 to be continuous after compression. The amount and position of application of the adhesive 21 before compression are previously adjusted so that the adhesive 21 does not flow out of the joint region R and bottom face C, and so that the discontinuous region becomes continuous after compression.

Since the gas in the space formed between the substrate 1 and seal substrate 2 by compression is discharged to the outside through the discontinuous portions by providing the discontinuous portions in the adhesive 21 before compression, the inner pressure of the space may be suppressed from increasing, the substrate 1 and seal substrate 2 may be suppressed from slipping out of position, and compressed state of the substrates may be stabilized. Communication of the gas between the inside of the hermetic space K and outside thereof is blocked by forming adhesive 21 to be continuous over the entire junction region R.

After bonding the substrate 1 and seal substrate 2 with the adhesive 21, the UV light is irradiated from the first irradiation unit 50 to the substrate 21 as the first irradiation step while compressing the seal substrate 2 onto the substrate 1 with the holding plate 61. The light source 51 emits a UV light with a wavelength of, for example, 360 nm. The UV light emitted from the light source 51 of the first irradiation unit 50 is irradiated onto the seal substrate 2 from each of the plural irradiation port 54 through the optical fiber 53. Since the irradiation port 54 is provided at the position corresponding to the adhesive 21 disposed on the joint region R, the UV light projected out of the irradiation port 54 irradiates the adhesive 21 by permeating through the wall of the seal substrate 2. The seal substrate 2 does not prevent the UV light from permeating through it since it is made of a UV permeable material, such as a glass.

The UV light from the irradiation port 54 irradiates the prescribed region (first region) AR1 of the adhesive 21 disposed on the joint region R, as shown in FIG. 8. The first region AR1 as a part of the region of the adhesive 21 is hardened within a short period of time by irradiating the UV light. Consequently, the substrate 1 and seal substrate 2 are temporarily assembled with the adhesive 21 of the hardened first region AR1.

Figure 12:
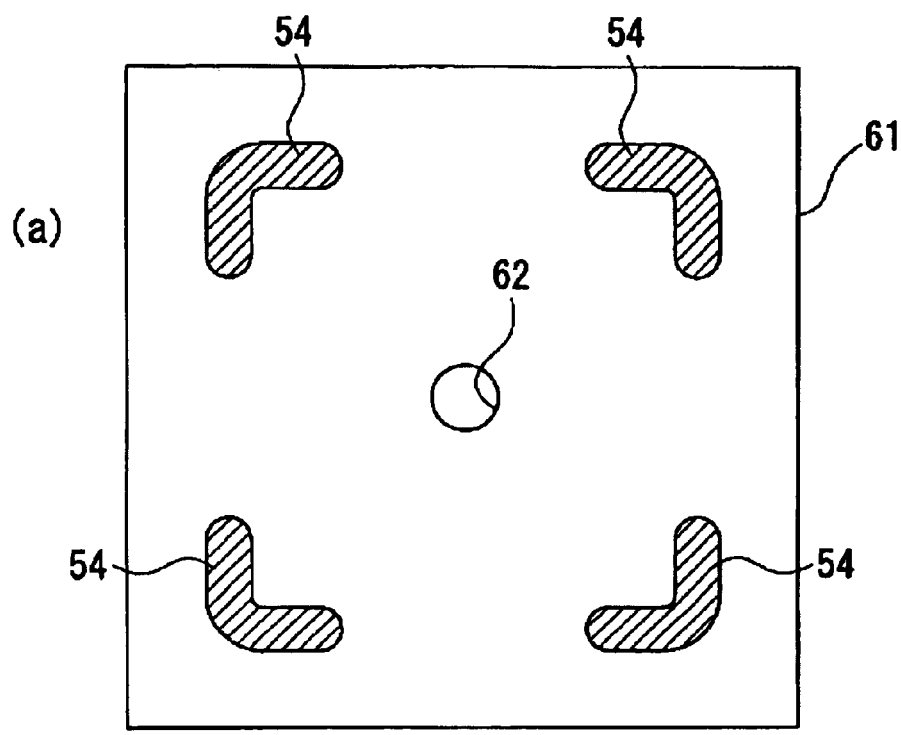
FIGS. 12($a$) and 12($b$) are schematics that show another exemplary embodiment of the first irradiation unit and holding unit.
Figure 12:
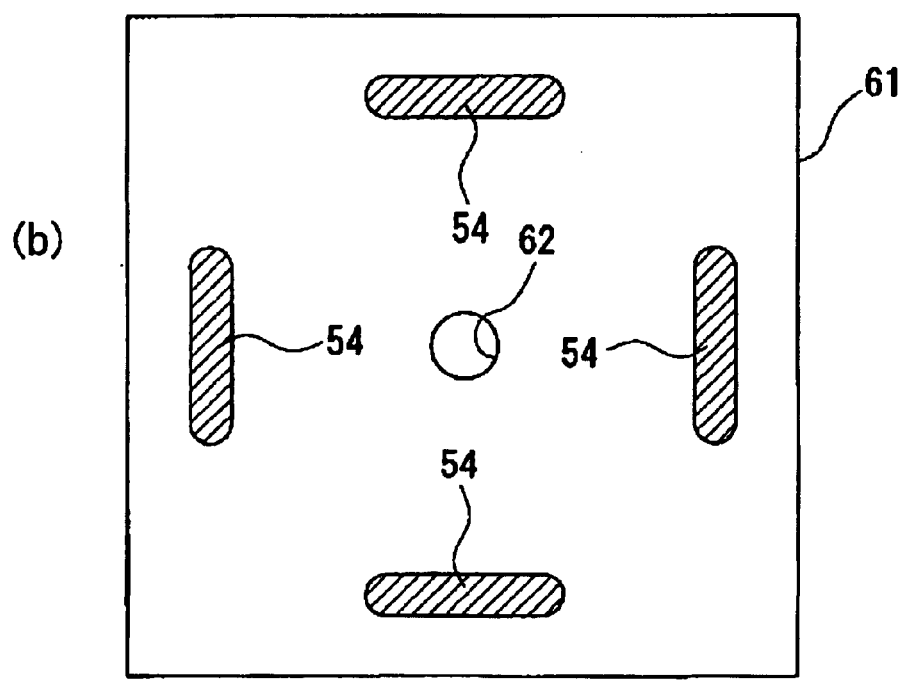

The amount of coating of the adhesive 21 (the amount of coating per unit area) is previously adjusted to be enhanced or optimum so that the temporary assembling is completed within a short period of time, and so that the substrate 1 is not peeled from the seal substrate 2, and the substrate 1 and seal substrate 2 does not slip out of position in the subsequent transfer step. The irradiation region (the first region AR1) of the UV light by the first irradiation unit 50 is also adjusted to be optimum so that the substrate 1 is not peeled from the seal substrate 2, and the substrate 1 and seal substrate 2 does not slip out of position, and so that the temporary assembling is completed within a time period as short as possible. The size and shape of the irradiation port 54 of the first irradiation unit 50 may be arbitrarily determined, such as an L-shape, of each irradiation port 54 as shown in the plan view in FIG. 12(*a*). The position of providing the irradiation port 54 (the region where the adhesive 21 is hardened by the first irradiation step) is not restricted to the edge, and may be provided at each side as shown in FIG. 12(b). The number of the adsorption hole 62 is not restricted to one hole, and the number and positions thereof may be arbitrarily determined. The first region AR1 that is hardened by the first irradiation step is adjusted to be smaller than the region not hardened (second region AR2).

The compression force by the holding unit 60 is determined, for example, to be 9.8 to 980 kPa in this exemplary embodiment. The compression step and first irradiation step are performed at a prescribed temperature (for example 20 to 50° C.).

After temporarily assembling the substrate 1 and seal substrate 2 by the first region AR1 of the adhesive 21, the UV light is irradiated from the second irradiation unit 70 to the second region AR2 of the adhesive 21 that is a region wider than the first region AR1 that is hardened by the first irradiation step, as shown in FIG. 9(c). As shown in FIG. 8, the second region AR2 corresponds to the region except the first region AR1 of the adhesive 21 disposed on the joint region R.

The second irradiation unit 70 includes a light source 71 capable of projecting a light having a prescribed wavelength (UV light with a wavelength of 300 to 380 nm in this exemplary embodiment), and a supporting unit 72 supporting a light source 71, and irradiates the UV light onto the entire adhesive 21 disposed on the junction region R through the UV permeable seal substrate 2. The second irradiation unit 70 irradiates the UV light to the second region AR2 as well as the first region AR1 of the adhesive 21 in this exemplary embodiment. Consequently, the entire adhesive 21 disposed on the joint region R is hardened to bond the substrate 1 to the seal substrate 2.

The light is irradiated with a prescribed luminous flux density (for example 30 to 100 mW/cm2) for a prescribed time interval (for example 30 to 200 seconds) in the second irradiation step to harden the adhesive 21 including the UV-curable material. The second irradiation step is also performed at a temperature of, for example, 20 to 50° C.

The luminous element 3 may be adversely affected by irradiating the UV light over the entire seal substrate 2 from above for hardening the adhesive 21 in the second irradiation step. Accordingly, it is recommended that a light shielding member (mask) 73 is provided at a position corresponding to the luminous element 3, such as the center of the seal substrate 2 as shown by the broken line in FIG. 9(c), when the UV light is irradiated, in order to irradiate the UV light only to the joint region R on which the adhesive 21 is disposed.

After completing the second irradiation step, the organic EL device A is placed in a heat-curing chamber 80. The adhesive 21 to bond the substrate 1 and seal substrate 2 is cured at a prescribed temperature (for example 30 to 80° C.) in the heat-curing chamber 80. The curing time is determined, for example, to be 30 minutes to 2 hours, and the pressure of the inside of the heat-curing chamber 80 is maintained at the atmospheric pressure. The adhesive 21 is hardened with higher density of cross-links by heat-curing, and the adhesive force between the substrate 1 and seal substrate 2 is improved while enhancing seal performance of the hermetic space.

The substrate 1 and seal substrate 2 can be temporarily assembled in a short period of time by hardening the adhesive 21 in the first region AR1 as described above, by disposing the adhesive 21 including the UV-curable material on the joint region R, and by irradiating the UV light to the first region AR1 in the first irradiation step. Since the waiting time of hardening is shortened, efficiency of the subsequent manufacturing steps may be enhanced. Moreover, adhesive property between the substrate 1 and seal substrate 2 may be enhanced by hardening the adhesive 21 on the second region AR2, by irradiating the UV light to the second region AR2 that is a region wider than the first region AR1. Separating the first irradiation step to temporarily assemble the substrate 1 and seal substrate 2 by hardening a part of the adhesive from the second irradiation step to harden the entire adhesive 21 permits workability and productivity to be enhanced, since the fist irradiation step is performed simultaneously with the second irradiation step. High sealing performance is attained by hardening the entire adhesive 21 in the second irradiation step, thereby enabling an organic EL device A that can exhibit desired high performance to be manufactured by protecting the luminous element 3 from being deteriorated.

The second irradiation step involves irradiation of the light to the second region AR2 as well as irradiation of the light to the first region AR1. Therefore, the entire adhesive 21 may be efficiently hardened after temporary assembling, because the entire adhesive 21 may be irradiated in the second irradiation step after irradiating a part of the adhesive 21 in the first irradiation step.

While the first region AR1 is described as if it were a different region from the second region AR2 in this exemplary embodiment, the present invention may be applied to the exemplary embodiment in which the second region AR2 involves the first region AR1. For example, when the first region AR1 accounts for 90% of the entire adhesive 21, and the second region AR2 corresponds to the entire region (or 100%) of the adhesive 21, the second region AR2 becomes to be wider than the first region AR1. The first irradiation unit 50 is able to irradiate the region 3% or more and less than 100% of the entire adhesive 21.

Since the substrate 1 and seal substrate 2 after bonding with the adhesive 21 is cured at a prescribed temperature after the second irradiation step, the adhesive 21 is completely hardened in the curing step to further enhance the adhesive property between the substrate 1 and seal substrate 2.

Since the bonding step is performed in an inert gas atmosphere inert to the luminous element 3 such as a nitrogen or argon atmosphere, the luminous element 3 is protected from being deteriorated during the manufacturing step.

Since the irradiation port 54 is provided on the holding plate 61 of the holding unit 60 capable of compressing the seal substrate 2 onto the substrate 1, the UV light may be irradiated while compressing the seal substrate 2 onto the substrate 1 with the holding plate 61 when the substrate 1 and seal substrate 2 is bonded together. Since the adhesive 21 is hardened in the first irradiation step while compressing the seal substrate 2 onto the substrate 1, the thickness of the adhesive 21 can be controlled. The thickness of the adhesive may be changed by the volume change of the adhesive at the time of hardening when the adhesive is hardened after compression. However, the change of the thickness of the adhesive 21 becomes small even by hardening the entire adhesive 21 in the second irradiation step, when a part of the adhesive 21 is hardened by UV irradiation while compressing the seal substrate 2 onto the substrate 1 with the holding unit 60 as in this exemplary embodiment. Accordingly, the thickness of the adhesive 21 after hardening may be adjusted to a desired thickness in the present invention.

The first irradiation unit 50 includes the light source 51 to emit the UV light, the optical fiber 53 to shunt the UV light projected out of the light source 51, and the irradiation port 54 to irradiate the UV light shunt by the optical fiber 53 to a plurality of desired sites of the junction region R. Consequently, the UV light can be irradiated to plural sites of the adhesive 21 using one light source 51. Therefore, the substrate 1 and seal substrate 2 can be temporarily assembled at plural sites using a simple apparatus, enabling temporary assembling to be stabilized.

The pressure in the space formed between the substrate 1 and seal sub substrate 2 may be increased, and the substrate 1 and seal substrate 2 may slip out of position when the substrate 1 is bonded to the seal substrate 2. However, the adhesive is applied by providing discontinuous portions when the adhesive 21 is applied in the step before compression. The compression step after discontinuously disposing the adhesive permits the gas to be discharged to the outside through the discontinuous portions, and the substrate and seal substrate may be reduced or prevented from slipping out of position due to pressure increase in the space.

The sensing unit 41 capable of detecting the distance between the joint region R of the substrate 1 and applicator 31 is provided, and the elevation in the height direction of the applicator 31 is adjusted based on the detected results by the sensing unit 41. Consequently, the applicator 31 is able to drip the adhesive from an appropriate height onto the joint region R, and the adhesive can be disposed at the desired sites of the joint region R with an enhanced or optimum amount of application.

While the adhesive is applied while adjusting the distance between the applicator 31 and substrate 1 based on the sensed results of the sensing unit 41 in the exemplary embodiment above, the surface configuration of the substrate 1 may be previously determined using the sensing unit 41 (without application operation) to store the sensed results in a memory, and the adhesive may be applied while adjusting the elevation of the applicator 31 based on the stored results.

While the adhesive is applied on the joint region R of the substrate 1 in the exemplary embodiment above, it is needless to say that the substrate 1 is bonded to the seal substrate 2 after applying the adhesive on the bottom face C of the seal adhesive 2.

While the holding unit 60 compresses the seal substrate 2 onto the substrate 1 by holding the seal substrate 2 in the exemplary embodiment above, it is needless to say that the substrate 1 may be held and compressed onto the seal substrate 2.

While the adhesive 21 was described as the UV-curable adhesive, the adhesive may be any material capable of bonding the substrate 1 and seal the substrate 2, and the EB (electron beam) curable material that can be hardened within a short period of time may be used for substrate 21.

Figure 13:
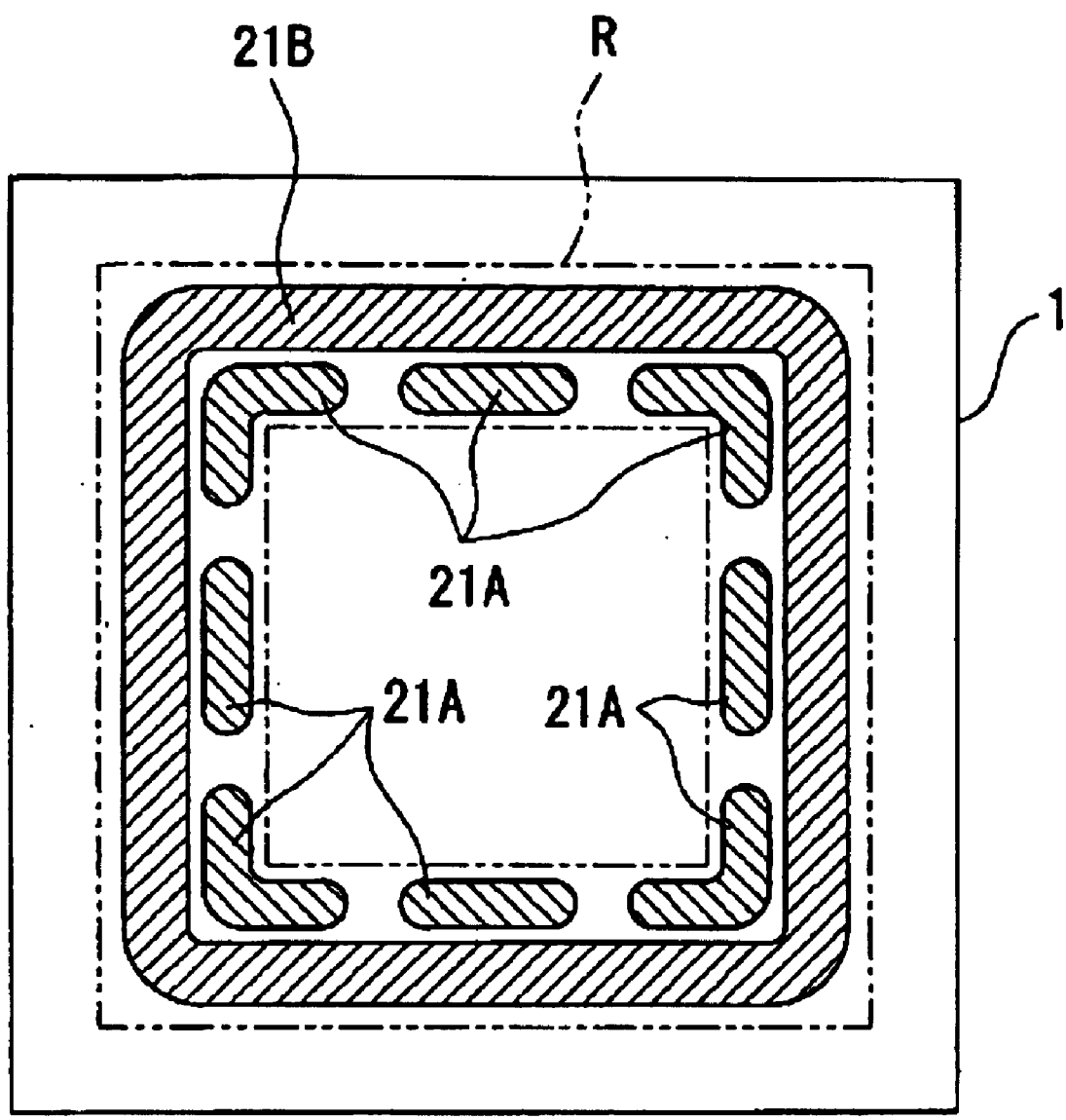
FIG. 13 is a schematic that shows another exemplary embodiment of the light-curable material to bond the first and second members.

While the adhesive 21 was described to be uniformly disposed on the joint region R, the adhesive may be unevenly disposed on different regions in the joint region R. For example, the adhesives 21A and 21B may be disposed at the inner region and outer region of the joint region R, respectively, as shown in FIG. 13 in another possible method. The adhesive 21 A disposed at the inner region is irradiated in the first irradiation step to temporarily assemble the substrate 1 and seal substrate 2 with the adhesive 21A disposed in this inner region, and the adhesive 21 B disposed at the peripheral region is subsequently irradiated in the second irradiation step, thereby hardening the entire adhesives 21A and 21B.

While the arrangement of the adhesive after compression and hardening is shown in FIG. 13, gaps may be provided since the adhesive 21A is used for temporary assembling. On the other hand, the adhesive 21B is disposed to be continuous since it is used for hermetic sealing.

The substrate 1 may be bonded to the seal substrate 2 by disposing a prescribed material at the region other than the region where the adhesive 21 has been disposed. The prescribed material may be an adhesive capable of bonding the substrate 1 and seal the substrate 2, or may be an arbitrary synthetic resin, such as polyacrylate or polymethacrylate, polyester, polyethylene or polypropylene, or a combination thereof. A hygroscopic material may be preferably used, for example, as the material to form the prescribed material, since moisture can be reduced or prevented from invading into the luminous element 3 from the outside to further enable the element to be protected from being deteriorated. The prescribed disposition sites are not particularly restricted, and the material may be disposed at arbitrary sites, such as the inside or outside of the adhesive 21.

Figure 14:
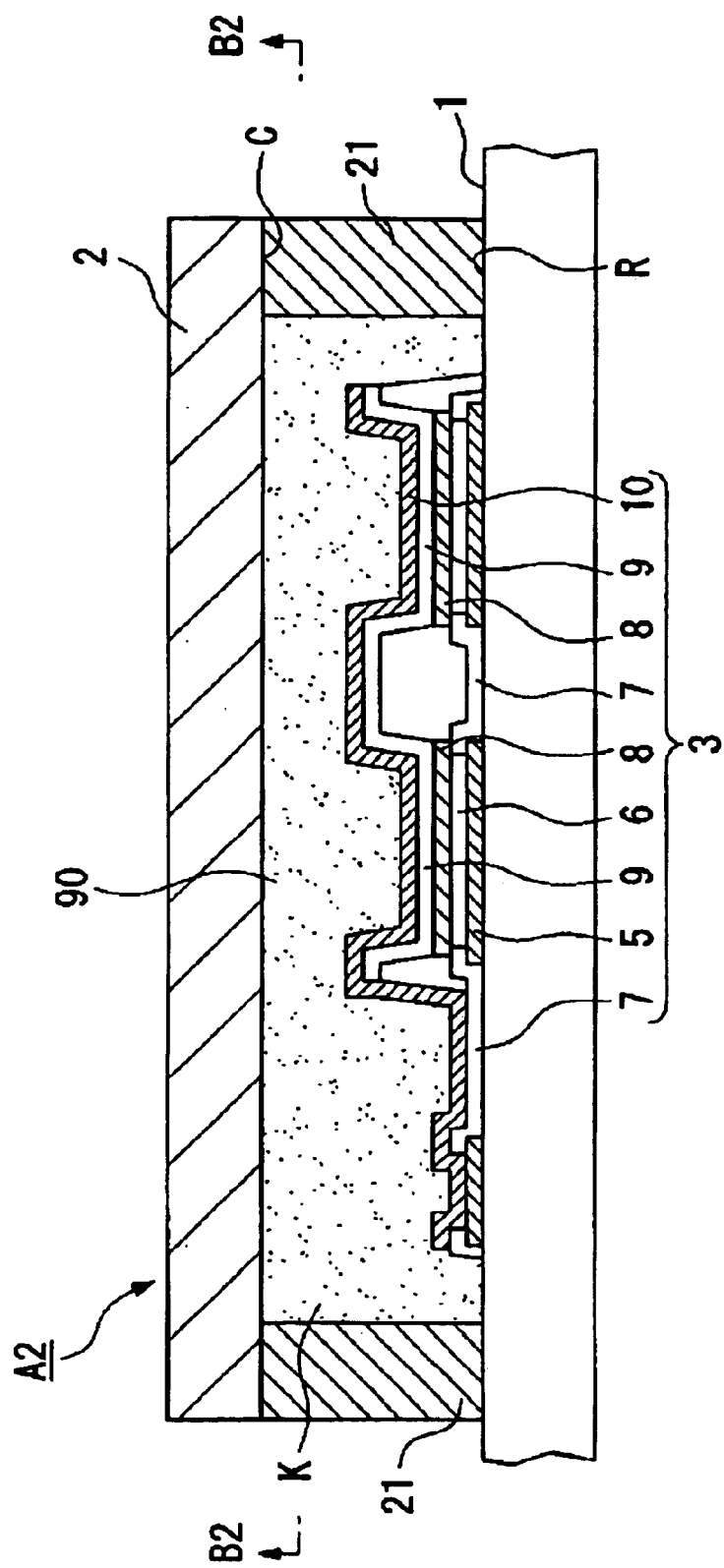
FIG. 14 is a cross-sectional view of a significant part of a further different exemplary embodiment of the electrooptical device according to the present invention.

While the hermetic space K is a cavity in the exemplary embodiment above, a filler may be filled in the hermetic space K, as shown in FIG. 14. FIG. 14 shows another exemplary embodiment of the organic EL device, where the equivalent constitution members as those in the organic EL device A shown in FIG. 7 are marked with the same reference numerals.

A filler 90 is filled in the hermetic space K of the organic EL device A2 shown in FIG. 14. The seal substrate 2 in the organic EL device A2 is a flat substrate, and the adhesive 21 is disposed so as to upwardly extend.

Figure 15:
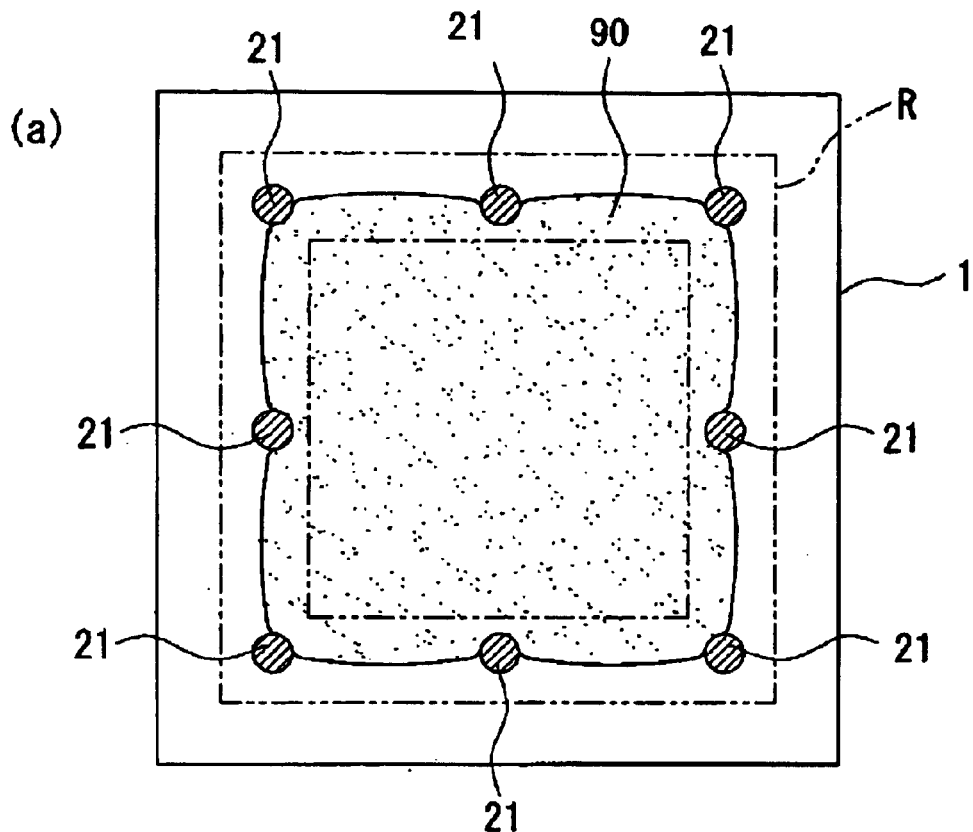
FIGS. 15(a) and 15(b) are cross-sectional views of the electrooptical device taken along plane B2–B2 in FIG. 14.
Figure 15:
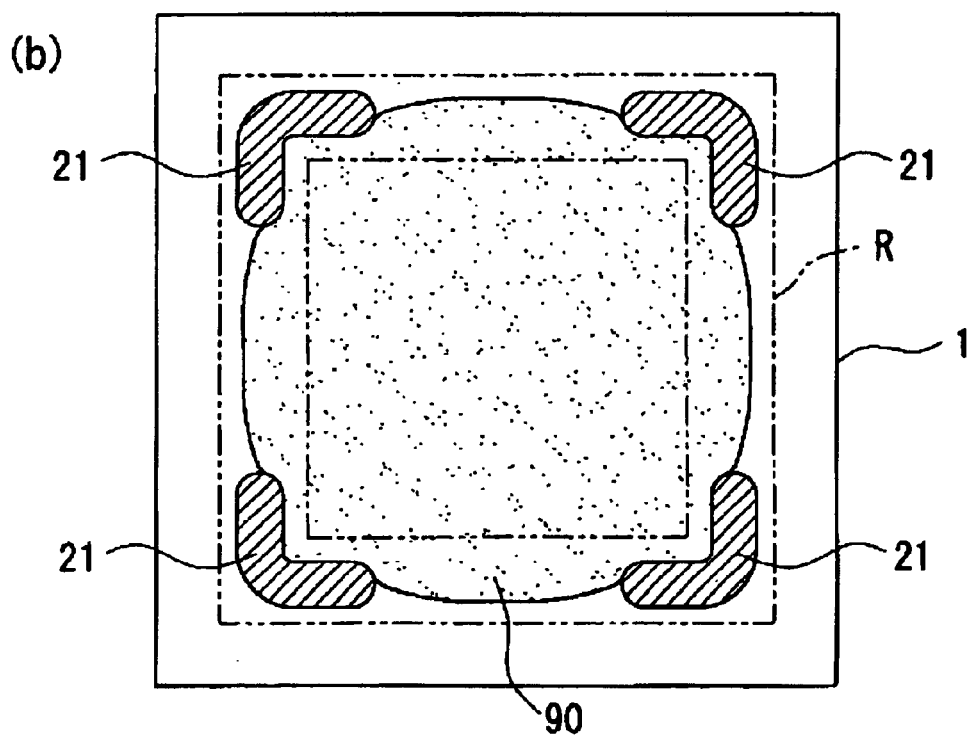

FIG. 15(*a*) is a cross-sectional view taken along Plane B2—B2 in FIG. 14. As shown in FIG. 15(*a*), the adhesive 21 is disposed intermittently (discontinuously), and the filler 90 is permitted to flow out of the gaps between the adhesives 21, thereby reducing or suppressing the substrate 1, seal substrate 2 and luminous element 3 from suffering from an excessive force. The position and shape in a plane view of the adhesive 21 may be arbitrarily determined, and the construction, as shown in FIG. 15(*b*), is also possible.

The material to form the filler 90 is preferably a solid at room temperature (environment temperature), and examples of the material include thermoplastic resins, such as polyolefin resins such as polyester and polyethylene, EVA and polyester resins. Alternatively, UV-curable materials, thermosetting materials and two component curable materials may be used. Examples of these curable resins include epoxy resins, acrylic resins and urethane resins.

An organic EL device having an excellent strength may be manufactured by providing the filler 90.

The technical scope of the present invention is not restricted to the exemplary embodiments above, and various modifications are possible within the range not departing from the spirit of the present invention.

For example, while the light emitted from the luminous element 3 is projected out of the element through the substrate 1 in the exemplary embodiments above, the present invention is valid when the light emitted from the luminous element 3 is projected out of the cathode 10 at the opposed side to the substrate 1 through the seal substrate 2. A light-permeable transparent or semi-transparent material is used for the seal substrate 2 in this case.

(Third Exemplary Embodiment)

The electronic appliances including the organic EL device A according to the first and second exemplary embodiments of the present invention are described below.

Figure 16:
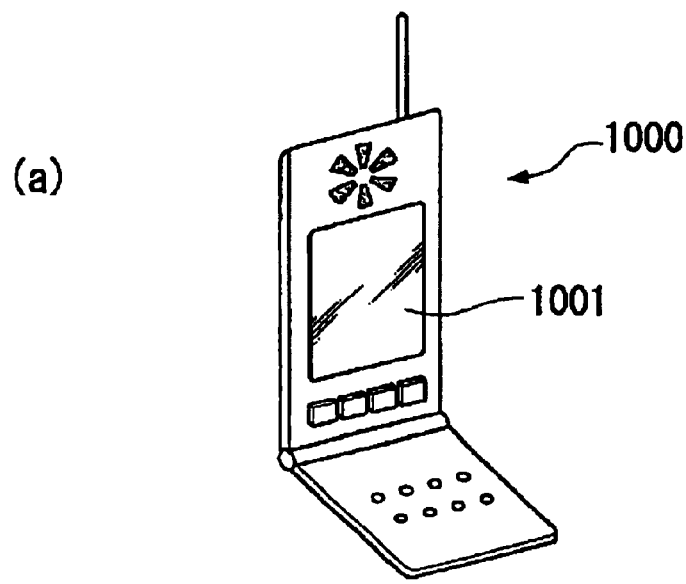
FIGS. 16(a)–16(c) are schematic perspective views that show exemplary electronic appliances that include the organic EL display, where
Figure 16:
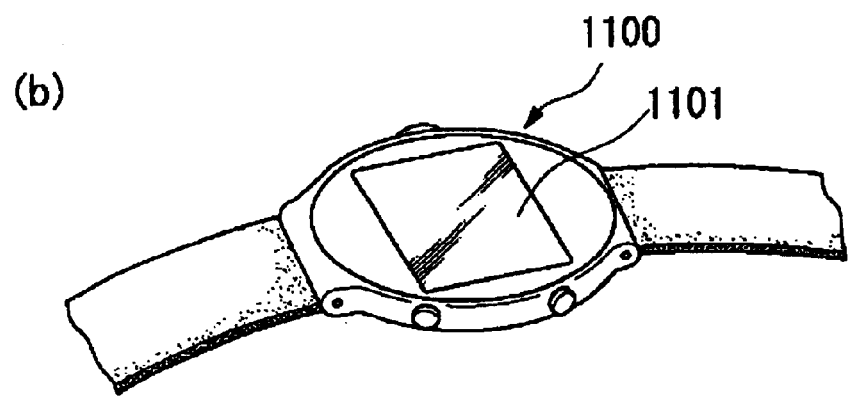
Figure 16:
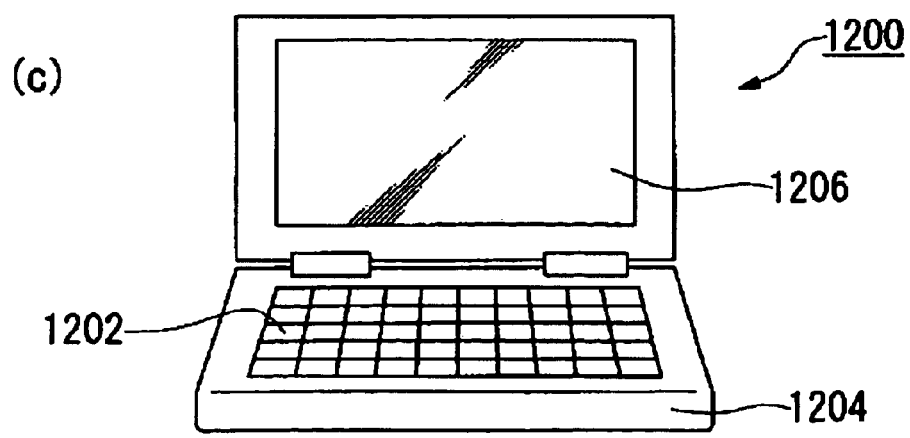

FIG. 16(*a*) is a perspective view showing an example of a portable phone. In FIG. 16(*a*), the reference numeral 1000 denotes a main unit of the portable phone, and the reference numeral 1001 denotes a display using the organic EL device A.

FIG. 16(b) is a perspective view showing an example of an electronic watch. In FIG. 1 6(b), the reference numeral 1100 denotes a main unit of the watch, and the reference numeral 1101 denotes a display using the organic EL device A.

FIG. 16(c) is a perspective view showing an example of a portable information processor, such as a word processor and personal computer. In FIG. 16(c), reference numeral 1200 denotes an information processor, reference numeral 1202 denotes an input unit, such as a keyboard, reference numeral 1204 denotes a main unit of the information processor, and reference numeral 1206 denotes a display using the organic EL device A.

Since the electronic appliances shown in FIGS. 16(a) to 16(c) include the organic EL device A in the exemplary embodiments above, electronic appliances including thin organic EL displays having a long service life may be provided.

The first member and second member can be temporarily assembled with the first material within a short period of time by disposing and hardening the first material curable within a short period of time and second material having desired performance such as hermetic performance at the joint region between the first member and second member, thereby enabling the subsequent manufacturing process to be efficiently performed. A hermetic function can be attained by hardening the second material. Consequently, the element is protected from being deteriorated to enable the electrooptical device that exhibits desired performance to be manufactured with good productivity.

The first member and second member can be temporarily assembled by hardening the light-curable material in the first region, by disposing the light-curable material at the joint region, and by irradiating a light to the first region in the first irradiation step. Since the waiting time of hardening is shortened, the subsequent manufacturing steps become efficient. The adhesive property between the first member and second member can be enhanced by hardening the light-curable material in the second region, by irradiating the light to the second region that is a region wider than the first region. Since the first irradiation step to temporarily assemble the first member and second member by hardening a part of the light-curable material, and the second step of hardening the entire light-curable material can be separated with each other, workability and productivity of manufacturing the electrooptical device can be enhanced.

What is claimed is:

1. A method of manufacturing an electrooptical device that includes a first member on which an electrooptical element is disposed, and a second member covering the electrooptical element, the method comprising:

(a) feeding an adhesive material to a first region and a second region of the joint region to bond the first member and second member;

(b) bonding the first member and second member with interposition of the adhesive material;

(c) hardening the adhesive material fed to the first region of the joint region; and (d) hardening the adhesive material fed to the second region of the joint region after step (c).

2. The manufacturing method according to claim 1, step (a) including:

(a-1) feeding a first adhesive material to the first region of the joint region; and (a-2) feeding a second adhesive material different from the first adhesive material to the second region of the joint region.

3. The manufacturing method according to claim 2, the first adhesive material being a light-curable material and the second adhesive material being a thermosetting material, step (c) including:

(c-1) irradiating a light having a prescribed wavelength to the light-curable material fed to the first region, and step (d) including:

(d-1) heating the thermosetting material fed to the second region.

4. The manufacturing method according to claim 1, further including performing steps (a)–(d) in an inert gas atmosphere.

5. The manufacturing method according to claim 1, step (a) including:

(a-3) discontinuously feeding the adhesive material to the first region and second region of the joint region.

6. The manufacturing method according to claim 5, step (b) including:

(b-1) compressing the first member and second member with each other so that the adhesive materials discontinuously fed in step (a-3) contact with each other.

7. The manufacturing method according to claim 1, second region of the joint region being wider than the second region, step (a) including:

(a-4) feeding the light-curable material to the first and second regions of the joint region, step (c) including:

(c-1) irradiating a light having a prescribed wavelength to the light-curable material fed to the first region, and step (d) including:

(d-2) irradiating a light having a prescribed wavelength to at least the light-curable material fed to the second region.

8. The manufacturing method according to claim 7, the first and second regions of the joint region being defined based on the irradiation range of the light according to steps (c) and (d).

9. The manufacturing method according to claim 7, further comprising:

(e) exposing the bonded first member and second member to a prescribed temperature environment for a prescribed period after step (d).

* * * * *